(12) United States Patent
Liao et al.

(10) Patent No.: US 7,421,019 B2
(45) Date of Patent: Sep. 2, 2008

(54) HIERARCHICAL ADAPTIVE EQUALIZER AND DESIGN METHOD THEREOF

(75) Inventors: Chien-Hsing Liao, Longtan Township, Taoyuan County (TW); Wei-Min Chang, Jhongli (TW); Tai-Kuo Woo, Jhonghe (TW); Shih-Che Lin, Jhonghe (TW); Jyh-Horng Wen, Minsyong Township, Chiayi County (TW)

(73) Assignee: Chung Shan Institute of Science and Technology, Armaments Bureau, M.N.D., Taoyuan (TW)

( * ) Notice: Subject to any disclaimer, the term of this patent is extended or adjusted under 35 U.S.C. 154(b) by 664 days.

(21) Appl. No.: 10/871,129

(22) Filed: Jun. 18, 2004

(65) Prior Publication Data

US 2005/0281327 A1      Dec. 22, 2005

(51) Int. Cl.
*H03H 7/30*     (2006.01)

(52) U.S. Cl. .................. 375/232; 375/233; 708/323

(58) Field of Classification Search .......... 375/229, 375/230, 232, 233; 330/304, 303, 302, 250; 708/323
See application file for complete search history.

(56) References Cited

U.S. PATENT DOCUMENTS

| 5,233,633 A * | 8/1993 | Baum et al. ................. 375/344 |
| 6,529,495 B1 * | 3/2003 | Aazhang et al. ............. 370/342 |

\* cited by examiner

*Primary Examiner*—Temesghen Ghebretinsae
(74) *Attorney, Agent, or Firm*—J.C. Patents

(57) ABSTRACT

A hierarchical adaptive equalizer and a design method thereof are disclosed. The design method divides N delay elements into a plurality of adaptive algorithms, each of the adaptive algorithms having $\beta$ delay elements. The design method logically structures a hierarchical tree with the adaptive algorithms. The hierarchical tree comprises $\alpha$ levels. A top first level of the hierarchical tree comprises $\beta^{\alpha-1}$ adaptive algorithms. A top second level of the hierarchical tree comprises $\beta^{\alpha-2}$ adaptive algorithms. A bottom level of the hierarchical tree comprises an adaptive algorithm.

23 Claims, 28 Drawing Sheets

HIERARCHICAL ADAPTIVE EQUALIZER AND DESIGN METHOD THEREOF

BACKGROUND OF THE INVENTION

1. Field of the Invention

The present invention relates to an adaptive equalizer, and more particularly to a hierarchical adaptive equalizer.

2. Description of the Related Art

Due to advance of communication technology and development of market, the population of use of mobile communication has skyrocketed. Because of limitations in bandwidth or topography, some adaptive and advance communication technology and systems keep on evolving. In such technology, algorithm and structure of Adaptive Equalizer Technique affect the performance of communication system. It has been essential in this industry. According to design of equalizers, equalizers can be classified based on type, structure and algorithm.

According to type classification, equalizers include linear equalizers or nonlinear equalizers. By structure classification, equalizers mainly include transversal equalizers regardless of the type of equalizers. Linear equalizers usually include finite impulse response (FIR) transversal equalizers; nonlinear equalizers usually include decision feedback equalizer (DFE) transversal equalizers. If classified based on algorithm, there are a variety of equalizers. Traditionally, algorithm equalizers include, for example, least mean square (LMS), recursive least square (RLS), constant modulus algorithm (CMA) equalizers, etc.

FIG. 12 is a drawing showing a prior art FIR transversal adaptive equalizer. In the prior art technology, the adaptive equalizer is a dynamically adjustable equalizer. The dynamically adjustable equalizer comprises a set of input signal vectors, a set of weighting vectors, and an adjusting mechanism, i.e. an adaptive control algorithm. The adaptive control algorithm is the core of the adaptive equalizer.

FIG. 13 is a drawing showing a prior art DFE transversal adaptive equalizer. In the prior art technology, the DFE transversal adaptive equalizer comprises a feed-forward filter 1206 and a feedback filter 1208. The operations of the filters are in accordance with the theory of the linear equalizer. Different in updated weightings, DFE algorithm uses errors to e(k) adjust the weighting of each filter which is generated by reducing the final output, i.e. Data Out, of DFE algorithm from the desired response d(k), instead of by reducing errors generated from each filter from the desired response d(k). Generally, the length of the feedback filter 1208 is shorter than that of the feed-forward filter 1206. The feed-forward filter 1206 outputs signals to the feedback filter 1208 for further decision. The feedback filter 1208 processes the signals outputted from the feed-forward filter 1206 to remove the remaining signal of the last signal caused by transmitting through multiple routes. Accordingly, DFE equalizer is not easy to be affected even when communication environment becomes worse.

For adaptive control algorithm, most linear and nonlinear adaptive control algorithms are classified in two types according to whether training sequence is applied. When applying training sequence to adjust weighting vectors, the algorithm is called non-blind adaptive algorithm. Both transmitter and receiver recognizes the training sequence d(t). During training, the transmitter sends signals to the receiver. After receiving the training sequence d(t), the receiver applies the training sequence d(t) to calculate weighting vectors $w_{opt}$. After such training is finished, the transmitter sends out data. The receiver applies the weighting vectors to process the received data. When training sequence is not applied, the algorithm is called blind adaptive algorithm. Blind equalizers, such as DFE-CMA, do not apply training sequence to evaluate. Accordingly, desired responses d(k) should be corrected. But most structures of blind equalizers are similar to those of non-blind equalizers.

FIG. 14 is a schematic drawing showing a prior art LMS algorithm. The prior art LMS algorithm comprises two basic processes: filtering process 1410 and adaptive process 1412. The filtering process 1410 generates the output of the filter by processing a set of input signals. The output of the filter is compared with the desired response for generating evaluated errors. The adaptive process 1412 dynamically adjusts the weighting vectors by using the evaluated errors. Such two processes cooperate.

Referring to FIG. 14, following are basic formulas of LMS algorithm:

Output of the transversal filter process 1410: $y(k)=\hat{w}^H(k)r(k)$

Evaluated errors: $e(k)=d(k)-y(k)$

Updated weightings of the adaptive process 1412:

$$\hat{w}(k+1)=\hat{w}(k)+\mu r(k)e^*(k)$$

wherein k represents the sequence of iteration; step size μ controls convergent rate; d(k) represents desired response; e(k) represents evaluated errors.

LMS algorithm is one of Stochastic Gradient algorithms. According to input data vector r(k), LMS algorithm stochastically evaluating gradient vectors. During iteration of LMS algorithm, 2N+1 times of complex multiplications are required, wherein N represents the number of elements. The calculation complexity of LMS algorithm is O(N). The output response of LMS algorithm depends on three factors: step size μ, number of weightings, and Eigen-values of input data vectors.

FIG. 15 is a schematic drawing showing a prior art RLS algorithm. In the prior art technology, RLS algorithm is an exception of Kalman Filter. Different from LMS algorithm which updates weighting vectors by applying the steepest-descent method, RLS algorithm adjusts weighting vectors by applying the least square method. RLS algorithm is characterized in applying data carried by input signals. As a result, RLS algorithm converges fast than LMS algorithm. But it also increases the calculation complexity of RLS algorithm. Due to its high convergent rate and no Eigenvalue spread, RLS algorithm has been applied in this field. For RLS algorithm with exponential weighting factor, cost function $$\varepsilon(k) = \sum_{i=1}^{k} \lambda^{k-i} |e(i)|^2$$

is minimized by selecting the kth weighting vector. e(i) represents errors between desired response d(i) and output y(i); λ is a positive constant close to, but less than, 1. Under static environment, λ is equal to 1 because all presented data have proper weightings. RLS algorithm can be executed from the cost function formulas via expansion of square and reverse matrix. Referring to FIG. 15, following are basic formulas of RLS algorithm:

$N \times 1$ gain vectors: $k(k) = \dfrac{\lambda^{-1} R^{-1}(k-1)r(k)}{1 + \lambda^{-1} r^H(k) R^{-1}(k-1) r(k)}$ Prior evaluated errors: $\xi(k) = d(k) - \hat{w}^H(k-1)r(k)$, wherein $\hat{w}^H(k-1)r(k)$ is the output of transversal filter 1510.

Updated weightings of adaptive control algorithm 1512 is shown as below:

$$\hat{w}(k) = \hat{w}(k-1) + k(k)\xi^*(k);$$

$$R^{-1}(k) = \lambda^{-1} R^{-1}(k-1) - \lambda^{-1} k(k) r^H(k) R^{-1}(k-1)$$

$\lambda$ represents weighting factors, adapted to modify performance of equalizers. If channel is fixed regardless of time, $\lambda$ can be set to 1. If channel varies with time, $\lambda$ can be set between 0.8 and 1. $\lambda$ does not change convergent rate, but affects tracking ability of RLS algorithm. The smaller the $\lambda$, the better the tracking ability of the filer. If $\lambda$ is too small, the filter becomes unstable. RLS algorithm requires $4N^2+4N+2$ times of complex multiplications, wherein N represents the number of elements. Accordingly, the calculation complexity of RLS algorithm is $O(N^2)$.

CMA minimizes output variance of the equalizer by applying constant modulus (CM). CM applies a specific minimized CM cost function. It is shown as below:

$$J_{CM} = E\{(|y(k)|^2 - \gamma)^2\};\ p = 2,\ q = 2.$$

y(k) represents the evaluated output of the equalizer; $\gamma$ is a dispersion constant. A blind CMA adaptive algorithm does not require training sequence because it calculates the evaluated errors by applying known characters of received signals. Digital communication signals, usually, have some characters, such as constant modulus property or spectral self-conference. Due to interference, noise and variation of channels with time, the characters of signals received by the receiver are vulnerable to such issues. Accordingly, some techniques are applied to rebuild the characters of signals and output rebuilt signals. Signals usually have a constant envelope, such as PSK or FM. When signals are transmitted via channels, distortion of signals may occur. CMA reduces distortion by adjusting adaptive weighting vectors. The cost function formula of CMA is: $J(k) = E[||y(k)|^p - \gamma|^q]$. The convergence of CMA depends on the factors, p and q. If p=2 and q=2, the basic formulas are shown as below:

Output of the filter: $y(k) = w^H(k) r(k)$

Evaluated errors: $e(k) = y(k)(1 - |y(k)|^2)$

Updated weightings: $w(k+1) = w(k) + \mu r(k) e^*(k)$

When the output $|y(k)| = 1$, the evaluated error is 0. The last three formulas are similar to those of LMS algorithm. $y(k)|y(k)|^2$ of CMA has the same effect of the desired signal $d(t)$ of LMS, adapted to generate evaluated errors. The design method of CMA has been widely applied for the structure of blind receivers.

The prior art LMS algorithm uses the last mean square error to adjust the weighting vectors, so it has low calculation complexity. But due to its high Eigen-value spread, LMS algorithm has low convergent rate. Moreover, when the number of taps of the equalizer increases, the convergent rate also becomes worse.

RLS algorithm is characterized in using input signals for carrying data. It has high convergent rate than that of LMS algorithm. The advantage also increases the calculation complexity of RLS algorithm.

CMA minimizes the output errors by applying CM. CMA, however, has two demerits. One is low convergent rate. The other is local minimum. The local minimum results from non-convexity of constant CM. As a result, the weighting vector of the equalizer converges to a local minimum, instead of global minimum, and intersymbol interference (ISI) cannot be completely removed.

SUMMARY OF THE INVENTION

Accordingly, the present invention is directed to a design method of a hierarchical adaptive equalizer. The design method is applied to develop a new adaptive equalizer algorithmic model or structure with a hierarchical structure. The design method randomly divides N basic elements of a filter into several adaptive algorithms and logically structures the adaptive algorithms as a hierarchical tress.

The present invention is also directed to a hierarchical adaptive equalizer. By the hierarchical structure, the hierarchical adaptive equalizer executes algorithmic operations for different levels and for individual adaptive algorithms. The adaptive algorithms in different levels process the input signals. Accordingly, the output of the hierarchical adaptive equalizer is more precise and the convergent rate is higher. Moreover, the mean square error (MSE) from the operation of the hierarchical adaptive equalizer is minimized when the hierarchical adaptive equalizer is in static status. The operation of the hierarchical adaptive equalizer also generates less complex data.

The present invention discloses a design method of a hierarchical adaptive equalizer. The design method first provides N delay elements. Then, the design method divides N delay elements into a plurality of adaptive algorithms, each of the adaptive algorithms having $\beta$ delay elements. The design method logically structures a hierarchical tree with the adaptive algorithms. The hierarchical tree comprises $\alpha$ levels. A top first level of the hierarchical tree comprises $\beta^{\alpha-1}$ adaptive algorithms. A top second level of the hierarchical tree comprises $\beta^{\alpha-2}$ adaptive algorithms. A bottom level of the hierarchical tree comprises an adaptive algorithm. N, $\alpha$ and $\beta$ are integers not less than 1, and N is not less than $\beta$.

According to the embodiment of the present invention, an output of the top first level of the hierarchical tree is an input of the top second level of the hierarchical tree.

According to the embodiment of the present invention, an output from the bottom level of the hierarchical tree is equivalent to an output from the hierarchical adaptive equalizer.

The present invention also discloses a hierarchical adaptive equalizer. The hierarchical adaptive equalizer is characterized in comprising a hierarchical tree. The hierarchical tree comprises $\alpha$ levels. A top first level of the hierarchical tree comprises $\beta^{\alpha-1}$ adaptive algorithms. A top second level comprises $\beta^{\alpha-2}$ adaptive algorithms. A bottom level comprises an adaptive algorithm. $\beta$ represents a number of delay elements for each of the adaptive algorithms, and $\alpha$ and $\beta$ are integers not less than 1.

According to the embodiment of the present invention, the hierarchical adaptive equalizer comprises N delay elements, N is equal to $\beta^{\alpha}$, and N is an integer not less than $\beta$.

According to the embodiment of the present invention, an output of the top first level of the hierarchical tree is an input of the top second level of the hierarchical tree.

According to the embodiment of the present invention, an output from the bottom level of the hierarchical tree is equivalent to an output from the hierarchical adaptive equalizer.

According to the embodiment of the present invention, the adaptive algorithms adopt an algorithmic method to execute a minimum algorithmic process and to individually update weightings of the adaptive algorithms.

The present invention adopts a hierarchical equalizer and a design method thereof. By the hierarchical structure, the present invention enhances convergent rate and reduce the complexity of the execution of algorithmic method. Such reduction of complexity makes the tracing of data feasible. When communication environment worsens, the hierarchical structure of the present invention substantially still outperforms and reduces the complexity of the execution of algorithmic method. The design method of the hierarchical adaptive equalizer can be applied to a multiple-level structure, and not limited to a linear equalizer. Accordingly, the design method of the hierarchical adaptive equalizer can be applied to a non-linear equalizer.

In order to make the aforementioned and other objects, features and advantages of the present invention understandable, a preferred embodiment accompanied with figures is described in detail below.

DESCRIPTION OF SOME EMBODIMENTS

Figure 1A:
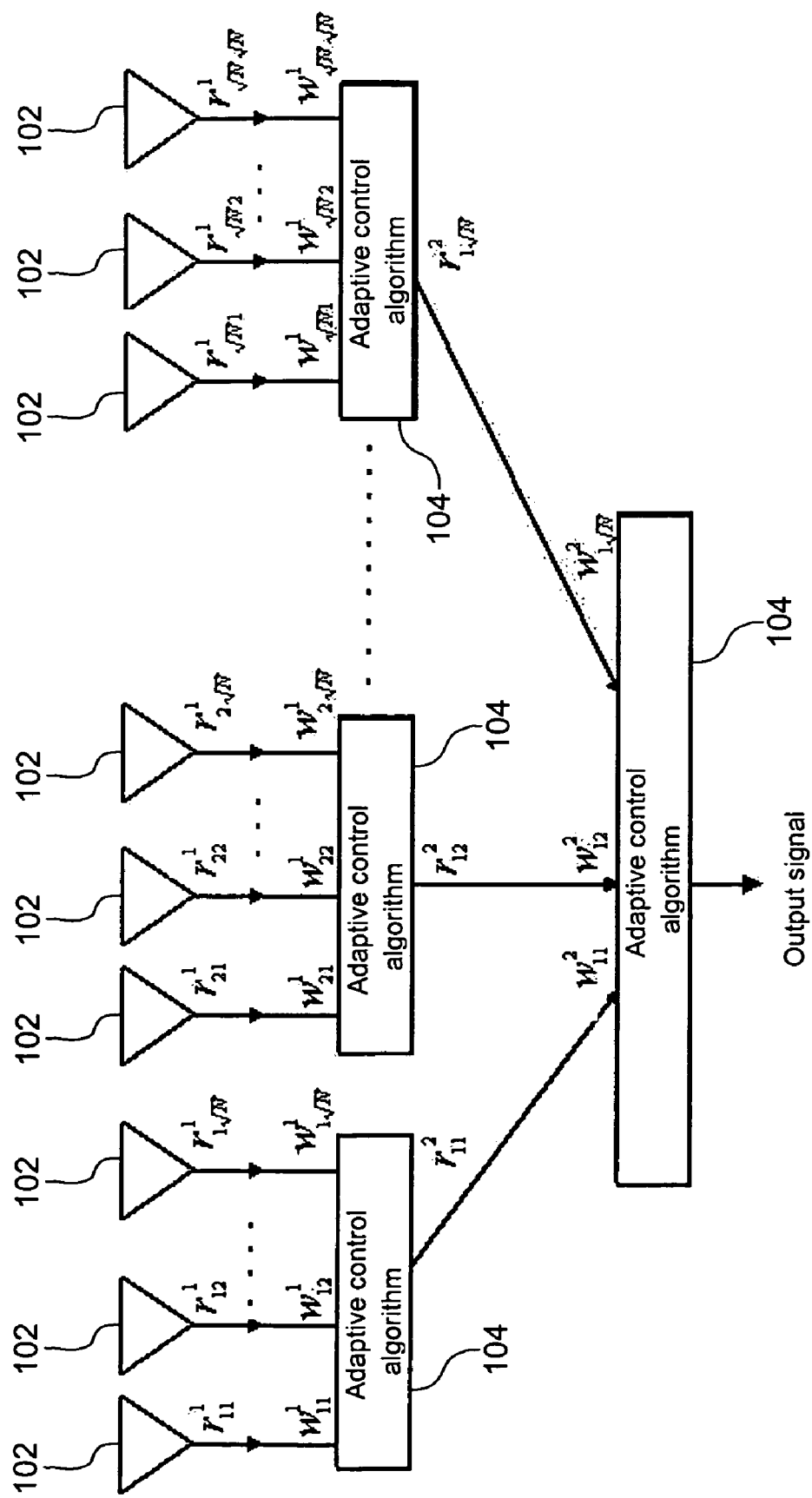
FIGS. 1A and 1B are a schematic structure drawing and a design flowchart of a hierarchical adaptive equalizer according to an embodiment of the present invention.
Figure 1B:
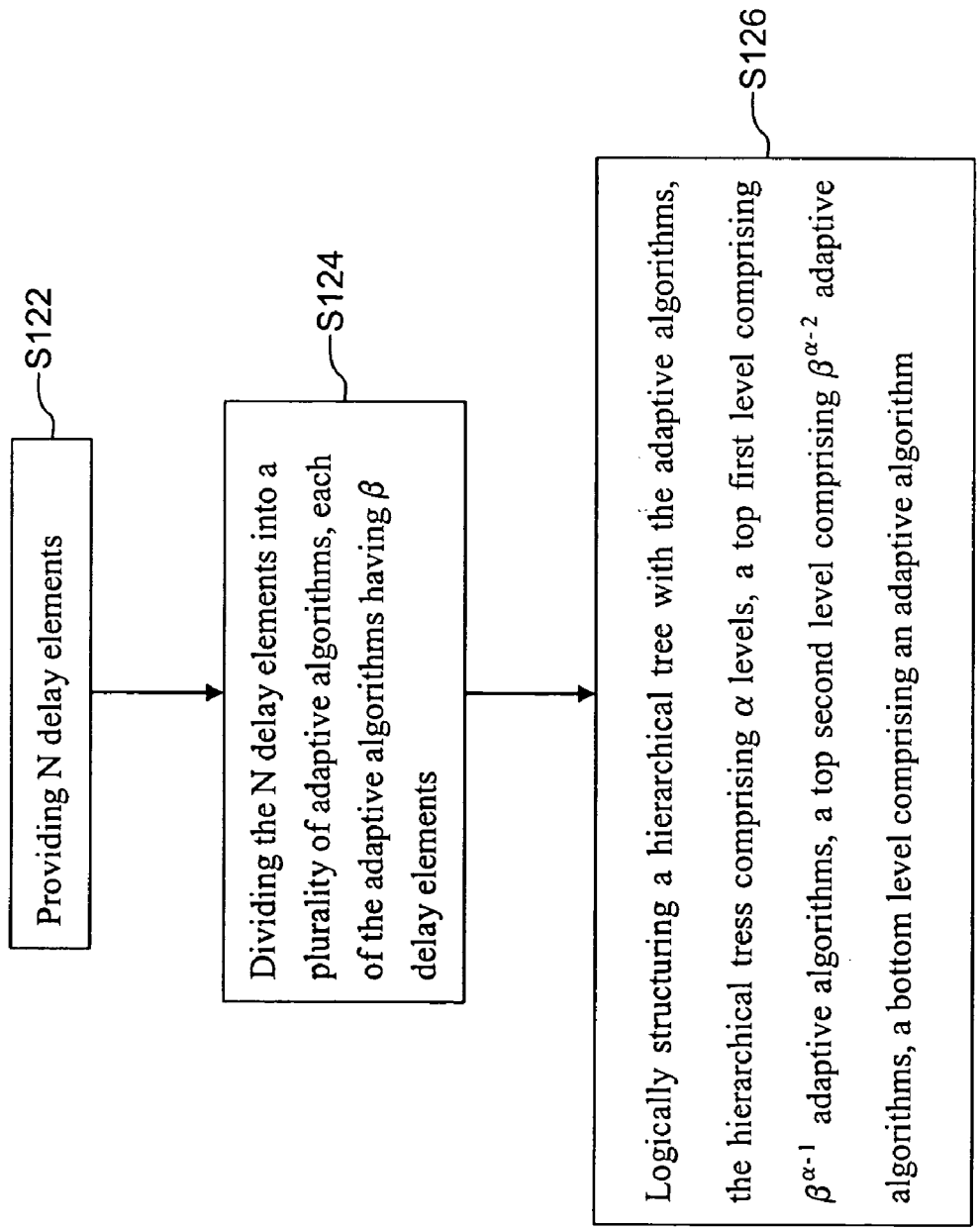

FIGS. 1A and 1B are a schematic structure drawing and a design flowchart of a hierarchical adaptive equalizer according to an embodiment of the present invention.

Referring to FIGS. 1A and 1B, the design method first provides N delay elements 102 in step S122. One of ordinary skill in the art understands that the delay elements can be, for example, filters or equalizers, but not limited thereto.

The delay elements 102 are divided into several adaptive algorithms 104. Each of the adaptive algorithms 104 comprises $\beta$ delay elements in step S124. The dividing of the delay elements 102 is in accordance with $\sqrt[\alpha]{N}$, wherein $\alpha$ represents the number of levels, and N represents the number of the total delay elements. The delay elements $\beta$ in each of the adaptive algorithm is equal to $\sqrt[\alpha]{N}$.

The design method then logically structures a hierarchical tree with the adaptive algorithms in step S 126. The hierarchical tree comprises $\alpha$ levels. A top first level of the hierarchical tree comprises $\beta^{\alpha-1}$ adaptive algorithms. A top second level comprises $\beta^{\alpha-2}$ adaptive algorithms. A bottom level comprises an adaptive algorithm. The total number of the adaptive algorithms in the hierarchical tree is in accordance with the following equation:

$$1 + \beta + \beta^2 + \ldots + \beta^{\alpha-1} = \frac{1-\beta^\alpha}{1-\beta}$$

N, $\alpha$ and $\beta$ are integers not less than 1; N is not less than $\beta$; and N equates to $\beta^\alpha$.

In this embodiment, each adaptive algorithm performs a minimized calculation, executes an adaptive control algorithmic method, and updates weightings of the adaptive algorithms. Multiplying input signals for the adaptive algorithms of the top first level with the updated weights generates outputs thereof. The outputs from the adaptive algorithms of the top first level are the inputs for the adaptive algorithms of the top second level. The outputs from the adaptive algorithms of the top second level is the real output of the filters. This design method can be applied to a multiple-level processing.

In this embodiment, the hierarchical adaptive equalizer is adapted for linear or non-linear adaptive equalizer algorithms, such as Least-Mean-Square (LMS) algorithm, Recursive-Least-Square (RLS) algorithm, constant modulus algorithm (CMA), Decision-Feedback-Equalizer-Least-Mean-Square (DFE-LMS) algorithm, Decision-Feedback-Equalizer-Recursive-Least-Square (DFE-RLS) algorithm, Decision-Feedback-Constant-Modulus algorithm (DFE-CMA), and a hybrid algorithm of two or more of the LMS, RLS, CMA, DFE-LMS, DFE-RLS, and DFE-CMA algorithms. The present invention, however, is not limited thereto.

In order to describe the hierarchical structure of the present invention in detail, following are descriptions of two-level hierarchical adaptive equalizer and a three-level hierarchical adaptive equalizer. The real output of the equalizer is $$\sum_{k=1}^{\beta} w_{1k}^\alpha r_{1k}^\alpha,$$

wherein $w_{1k}^\alpha$ represents the kth weighting of the bottom level adaptive algorithm, and $r_{1k}^\alpha$ represents the kth input signal for the bottom level adaptive algorithm.

Figure 2:
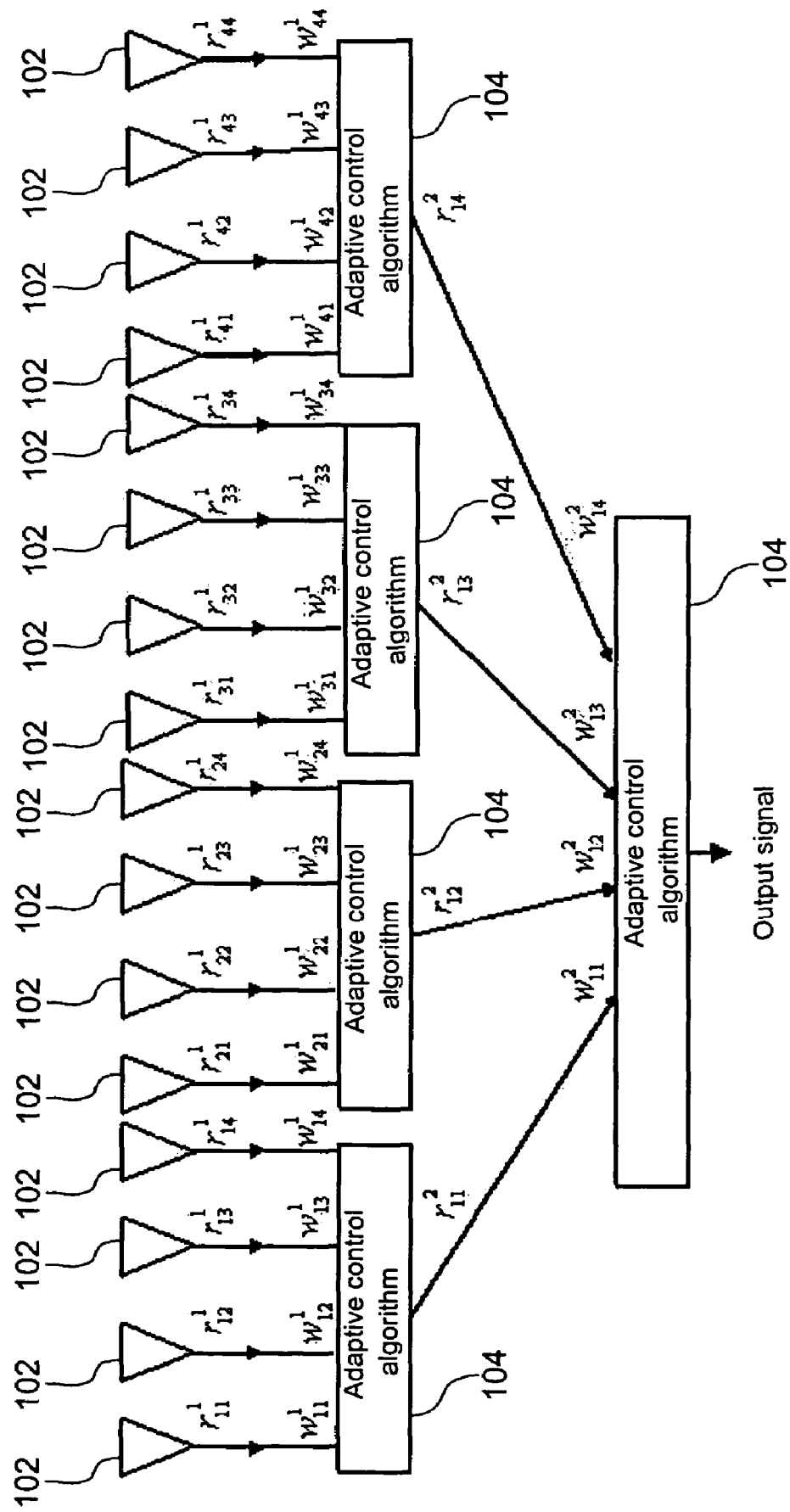
FIG. 2 is a design structure of a two-level hierarchical adaptive equalizer according to an embodiment of the present invention.

FIG. 2 is a design structure of a two-level hierarchical adaptive equalizer according to an embodiment of the present invention. Referring to FIG. 2, there are 16 delay elements (N=16). According to the dividing described, the hierarchical tree comprises two levels ($\alpha$=2). Each of the adaptive algorithms comprises four delay elements ($\beta$=4). Accordingly, the first level comprises four adaptive algorithms, and the second level comprises one adaptive algorithm. In this embodiment, $r_{ij}^l$ and $w_{ij}^l$ represent the input signal and the weighting of the jth element of the ith adaptive algorithm of the lth layer. FIG.

3 also uses the same representation. For the first level, the input signals for the adaptive algorithms are: $(r_{11}^1,r_{12}^1,r_{13}^1,r_{14}^1)$, $(r_{21}^1,r_{22}^1,r_{23}^1,r_{24}^1)$, $(r_{31}^1,r_{32}^1,r_{33}^1,r_{34}^1)$ and $(r_{41}^1,r_{42}^1,r_{43}^1,r_{44}^1)$. For the second level, the input signals for the adaptive algorithm are: $(r_{11}^2,r_{12}^2,r_{13}^2,r_{14}^2)$. The relationship between the input signals of the first and second levels is shown as below:

$$r_{11}^2 = w_{11}^1 r_{11}^1 + w_{12}^1 r_{12}^1 + w_{13}^1 r_{13}^1 + w_{14}^1 r_{14}^1;$$
$$r_{12}^2 = w_{21}^1 r_{21}^1 + w_{22}^1 r_{22}^1 + w_{23}^1 r_{23}^1 + w_{24}^1 r_{24}^1$$

$$r_{13}^2 = w_{31}^1 r_{31}^1 + w_{32}^1 r_{32}^1 + w_{33}^1 r_{33}^1 + w_{34}^1 r_{34}^1;$$
$$r_{14}^2 = w_{41}^1 r_{41}^1 + w_{42}^1 r_{42}^1 + w_{43}^1 r_{43}^1 + w_{44}^1 r_{44}^1$$

In the hierarchical structure, the real output of the equalizer is the output of the bottom level. In this embodiment, the real output of the equalizer is equivalent to the output of the second level. The output of the equalizer can be represented as $$\sum_{k=1}^{4} w_{1k}^2 r_{1k}^2.$$

Figure 3:
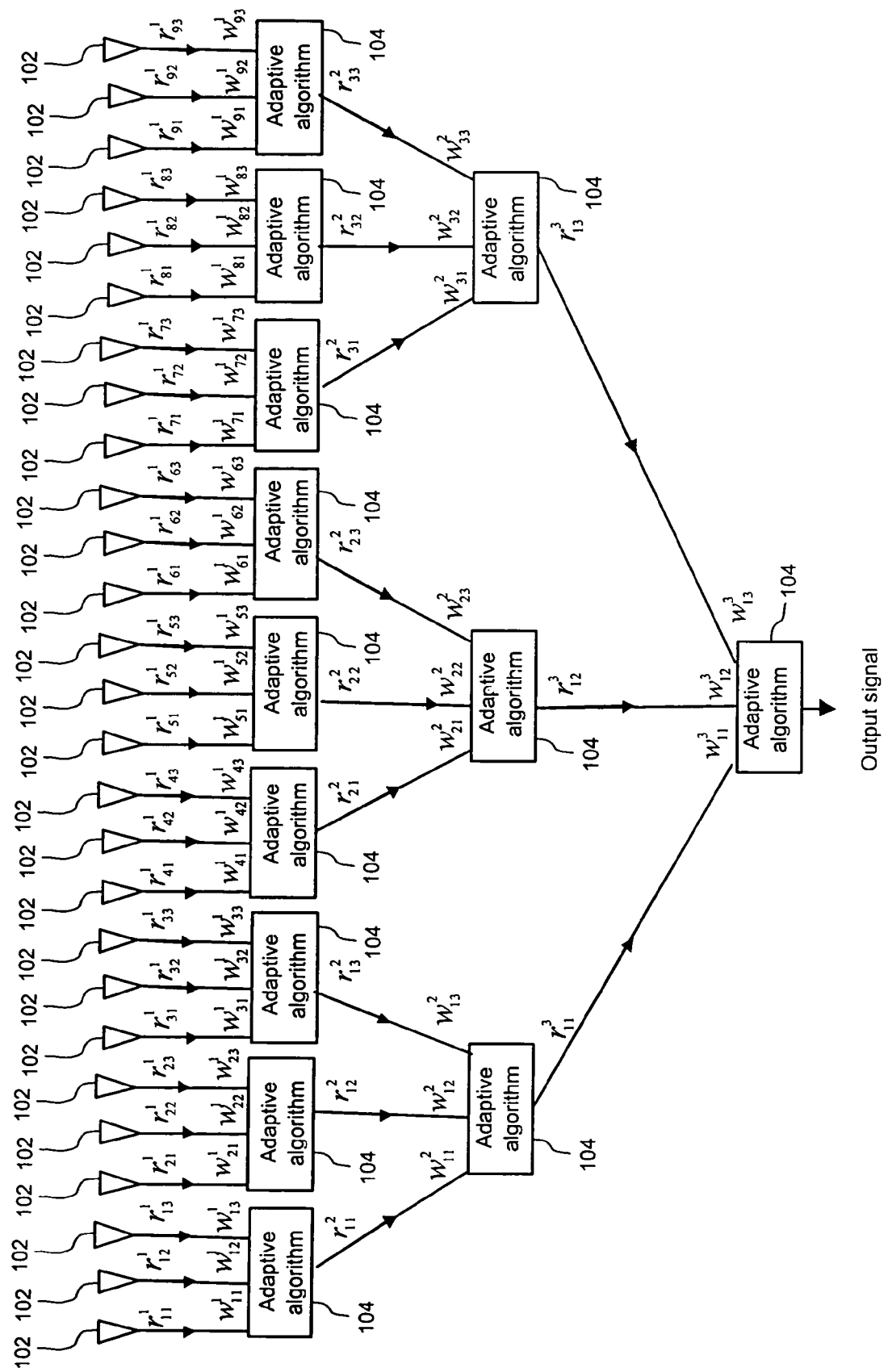
FIG. 3 is a design structure of a three-level hierarchical adaptive equalizer according to an embodiment of the present invention.

FIG. 3 is a design structure of a three-level hierarchical adaptive equalizer according to an embodiment of the present invention. Referring to FIG. 3, there are 27 delay elements (N=27). According to the dividing described above, the hierarchical tree comprises three levels ($\alpha$=3). Each of the adaptive algorithms comprises three delay elements ($\beta$=3). Accordingly, the first level comprises nine adaptive algorithms; the second level comprises three adaptive algorithms; the third level comprises one adaptive algorithm. In this embodiment, $r_{ij}^l$ and $w_{ij}^l$ are similar to those in FIG. 2. For the first level, the input signals for the adaptive algorithms are:

$(r_{11}^1,r_{12}^1,r_{13}^1)$, $(r_{21}^1,r_{22}^1,r_{23}^1)$, $(r_{31}^1,r_{32}^1,r_{33}^1)$, $(r_{41}^1,r_{42}^1,r_{43}^1)$, $(r_{51}^1,r_{52}^1,r_{53}^1)$, $(r_{61}^1,r_{62}^1,r_{63}^1)$, $(r_{71}^1,r_{72}^1,r_{73}^1)$, $(r_{81}^1,r_{82}^1,r_{83}^1)$, and $(r_{91}^1,r_{92}^1,r_{93}^1)$.

For the second level, the input signals for the adaptive algorithms are: $(r_{11}^2,r_{12}^2,r_{13}^2)$, $(r_{21}^2,r_{22}^2,r_{23}^2)$, and $(r_{31}^2,r_{32}^2,r_{32}^2)$. For the third level, the input signals for the adaptive algorithm are: $(r_{11}^3,r_{12}^3,r_{13}^3)$. The relationship between the input signals of the first and second levels is shown as below:

$$r_{11}^2 = w_{11}^1 r_{11}^1 + w_{12}^1 r_{12}^1 + w_{13}^1 r_{13}^1; r_{12}^2 = w_{21}^1 r_{21}^1 + w_{22}^1 r_{22}^1 + w_{23}^1 r_{23}^1;$$

$$r_{13}^2 = w_{31}^1 r_{31}^1 + w_{32}^1 r_{32}^1 + w_{33}^1 r_{33}^1; r_{21}^2 = w_{41}^1 r_{41}^1 + w_{42}^1 r_{42}^1 + w_{43}^1 r_{43}^1;$$

$$r_{22}^2 = w_{51}^1 r_{51}^1 + w_{52}^1 r_{52}^1 + w_{53}^1 r_{53}^1; r_{23}^2 = w_{61}^1 r_{61}^1 + w_{62}^1 r_{62}^1 + w_{63}^1 r_{63}^1;$$

$$r_{31}^2 = w_{71}^1 r_{71}^1 + w_{72}^1 r_{72}^1 + w_{73}^1 r_{73}^1; r_{32}^2 = w_{81}^1 r_{81}^1 + w_{82}^1 r_{82}^1 + w_{83}^1 r_{83}^1;$$

$$r_{33}^2 = w_{91}^1 r_{91}^1 + w_{92}^1 r_{92}^1 + w_{93}^1 r_{93}^1$$

The relationship between the input signals of the second and third levels is shown as below:

$$r_{11}^3 = w_{11}^2 r_{11}^2 + w_{12}^2 r_{12}^2 + w_{13}^2 r_{13}^2; r_{12}^3 = w_{21}^2 r_{21}^2 + w_{22}^2 r_{22}^2 + w_{23}^2 r_{23}^2;$$

$$r_{13}^3 = w_{31}^2 r_{31}^2 + w_{32}^2 r_{32}^2 + w_{33}^2 r_{33}^2$$

In the hierarchical structure, the real output of the equalizer is the output of the bottom level. In this embodiment, the real output of the equalizer is equivalent to the output of the third level. The output of the equalizer can be represented as $$\sum_{k=1}^{3} w_{1k}^3 r_{1k}^3.$$

Figure 4:
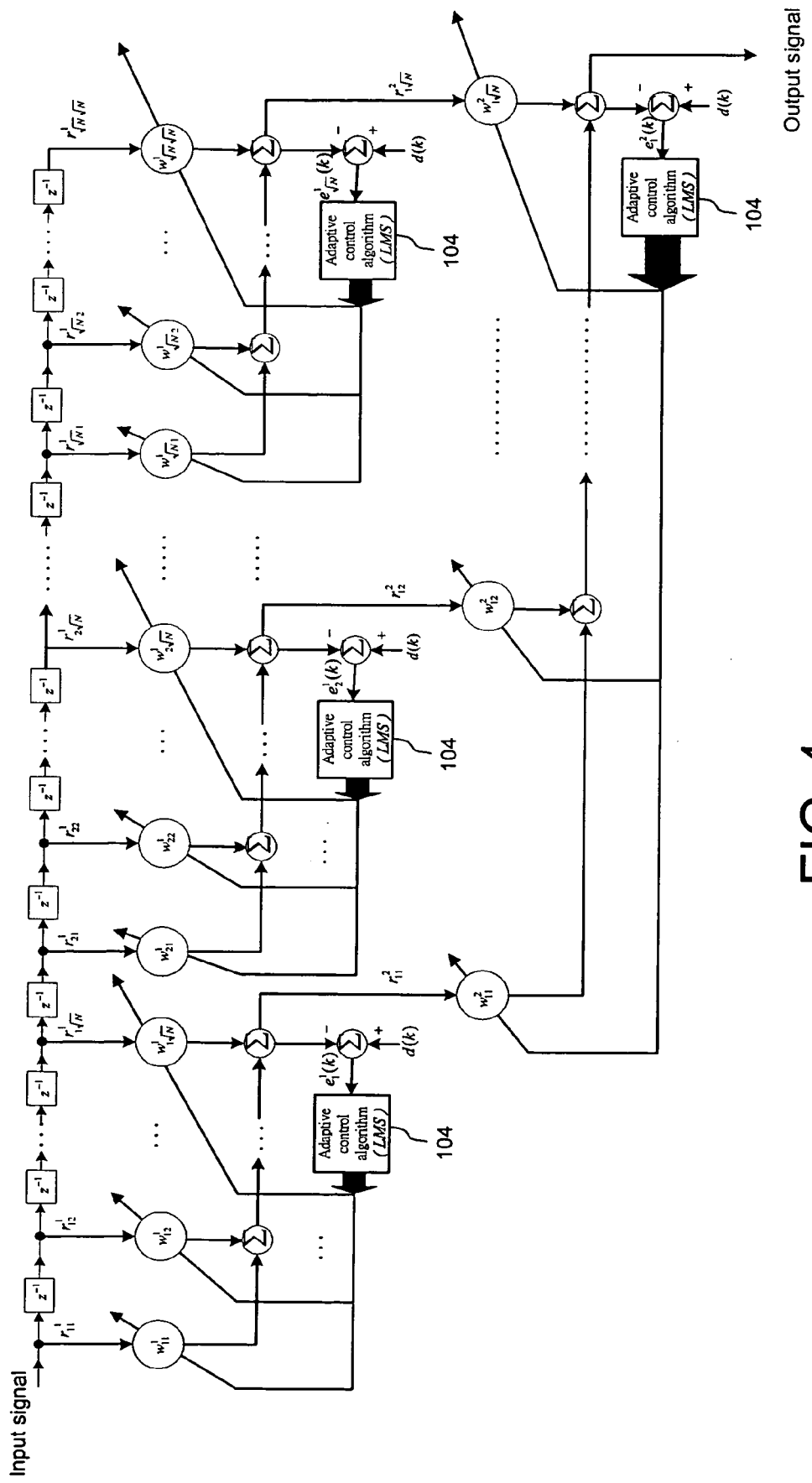
FIG. 4 is a detail structure of a hierarchical adaptive equalizer according to an embodiment of the present invention.

FIG. 4 is a detail structure of a hierarchical adaptive equalizer according to an embodiment of the present invention. The adaptive algorithms are adapted for hierarchical least mean-square (HLMS) algorithm.

The HLMS algorithm allocates input signals to the hierarchical adaptive algorithms. Each of the adaptive algorithms executes least mean-square (LMS) calculation. The purpose of such allocation is to execute a minimized calculation in each of the adaptive algorithms. As a result, the bottom level adaptive algorithm can generates a better output and a smaller mean square error. According to the HLMS algorithm, the calculation complexity is O(N). The whole calculation complexity is equal to the number of the adaptive algorithms multiplying the calculation complexity of one adaptive algorithm. For LMS algorithm, the calculation complexity of one adaptive algorithm is $2\beta+1$. The number of whole adaptive algorithms is $$1 + \beta + \beta^2 + \ldots + \beta^{\alpha-1} = \frac{1-\beta^\alpha}{1-\beta}.$$

The whole calculation complexity, according to the LMS algorithm, is equal to $$\frac{(1-\beta^\alpha)(2\beta+1)}{1-\beta} = O(\beta^\alpha) = O(N).$$

Accordingly, the whole calculation complexity is O(N) which is similar to that of LMS algorithm.

Figure 5A:
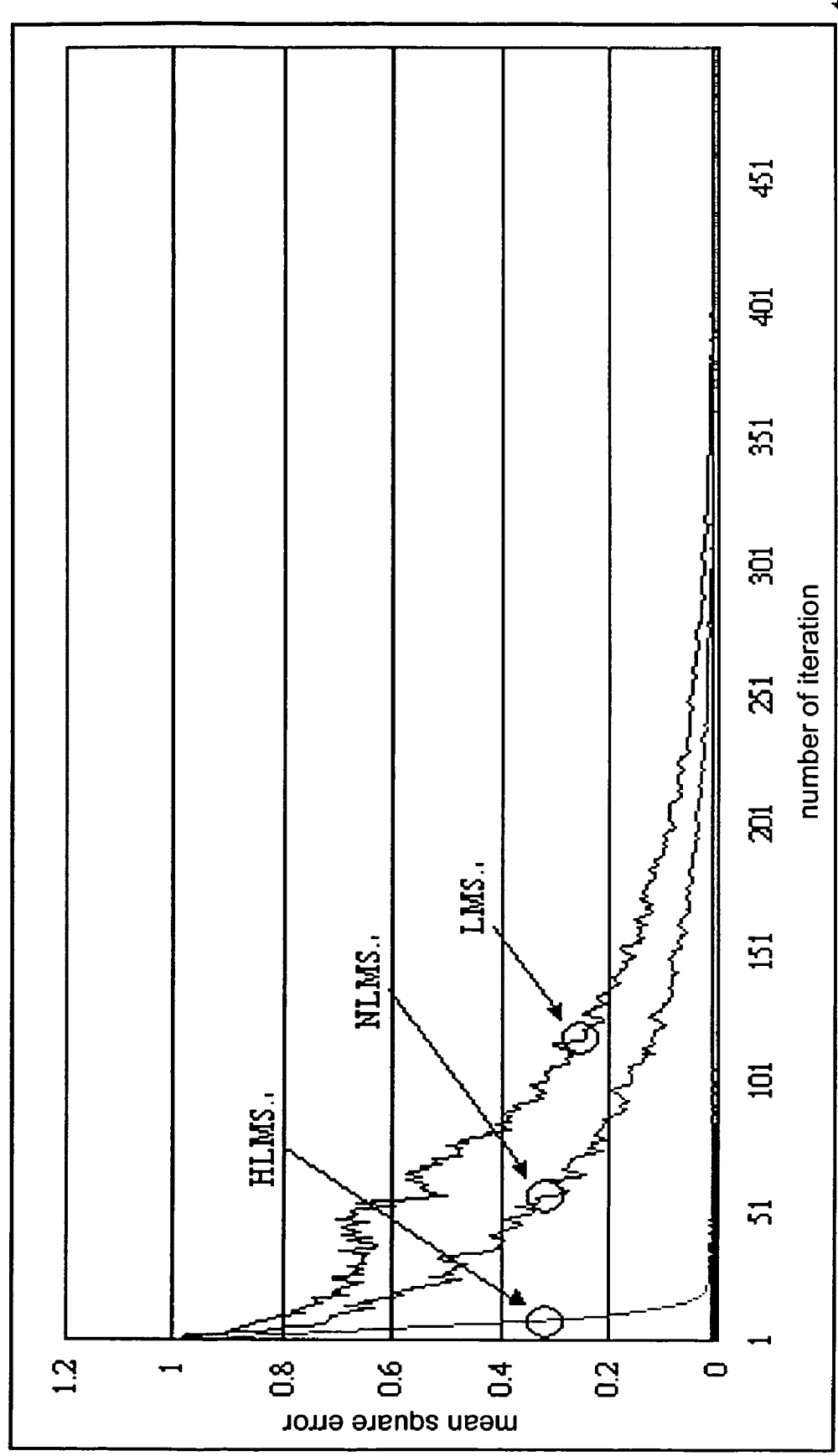
FIGS. 5A-5C are simulations of mean square error and convergent rate for HLMS algorithm according to the present invention.
Figure 5B:
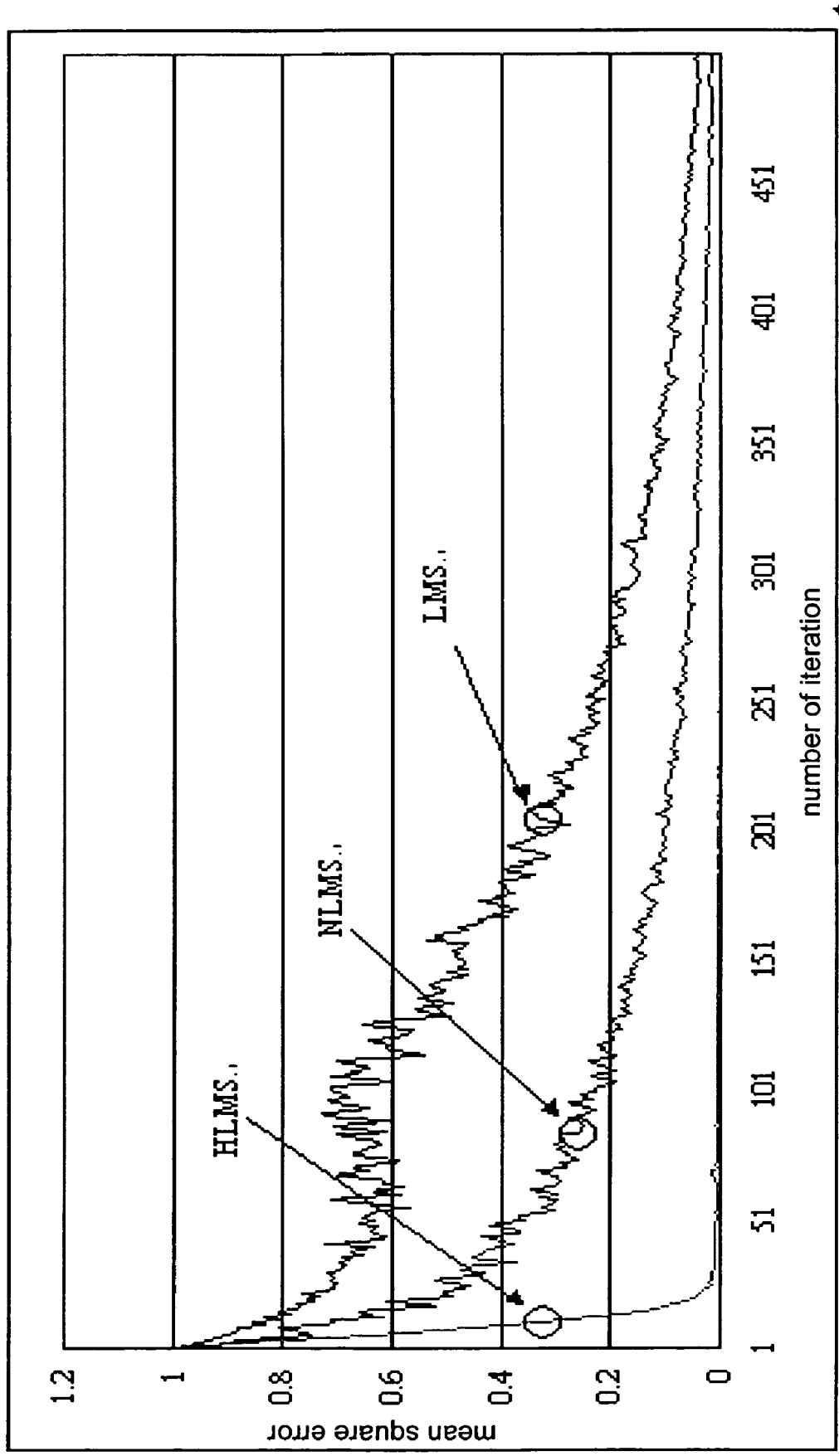
Figure 5C:
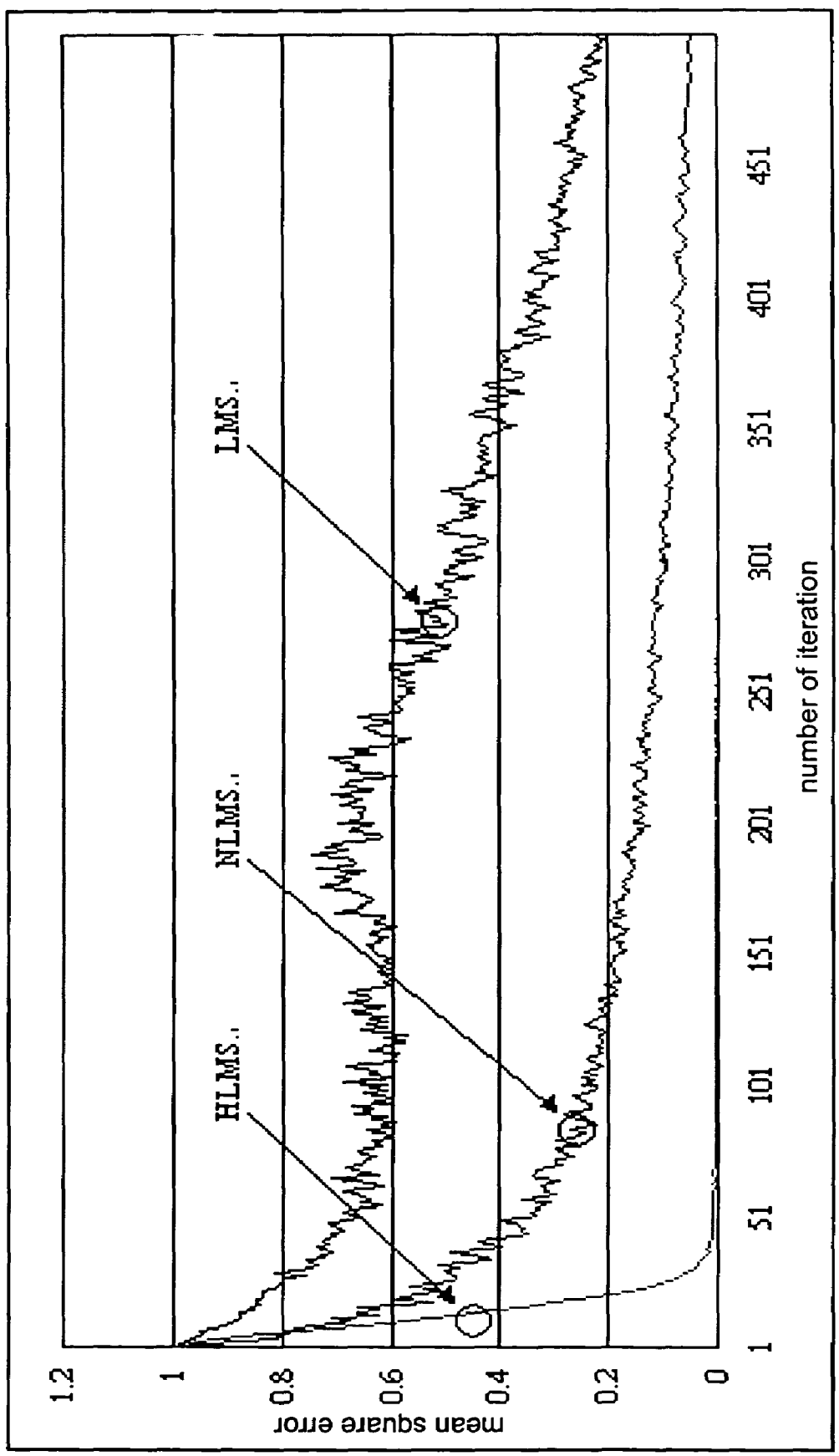

FIGS. 5A-5C are simulations of mean square error and convergent rate for HLMS algorithm according to the present invention. Under the HLMS algorithmic simulation, the equalizer comprises N input signals. The hierarchical tree comprises two levels ($\alpha$=2). Each of the adaptive algorithms comprises $\sqrt{N}$ elements ($\beta=\sqrt{N}$). The frequency response is represented by the following equation:

$$h(k) = \frac{1}{2}[1 + \cos(2\pi(k-2)/W],$$

k=1,2,3,4 (it represents four multiple-route signals), W=3.1

During the simulations, the convergent rates and static mean square errors (MSE) of the LMS, Normalized (NLMS) and HLMS are compared and shown in Table 1. The step size $\mu$ of NLMS is adjusted by the following equation:

$$\mu(k) = \frac{1.3}{7 + \underline{r}^T(k)\underline{r}(k)}$$

N=49, 100 and 196 (1)

SNR=30 dB (2)

TABLE 1

|  | LMS | NLMS | HLMS |
| --- | --- | --- | --- |
| N = 49 | 0.006869 | 0.00706 | 0.003276 |
| N = 100 | 0.045146 | 0.018263 | 0.000992 |
| N = 196 | 0.20651 | 0.049288 | 0.00118 |

Referring to FIGS. 5A-5C, HLMS algorithm has a higher convergent rate than those of LMS and NLMS algorithms. During the static status, HLMS algorithm has a smaller mean square error that those of LMS and NLMS algorithms shown in Table 1. Referring to FIG. 5A, the convergent rate of HLMS algorithm is higher than that of NLMS algorithm which is higher than that of LMS algorithm. When the number of elements is increased, the difference among HLMS, NLMS and LMS are more obvious as shown in FIGS. 5B and 5C.

Following are the descriptions of the execution of Hierarchical Recursive Least Square (HRLS) algorithm. Referring to FIG. 4, HRLS algorithm is a hierarchical calculation of RLS by hierarchical adaptive algorithms. The HRLS algorithm allocates input signals to the hierarchical adaptive algorithms. Each of the adaptive algorithms executes RLS calculation. The purpose of such allocation is to execute a minimized calculation in each of the adaptive algorithms. As a result, the bottom level adaptive algorithm can generates a better output and a smaller mean square error. According to the HRLS algorithm, the calculation complexity is O(Nβ). The whole calculation complexity is equal to the number of the adaptive algorithms multiplying the calculation complexity of one adaptive algorithm. For RLS algorithm, the calculation complexity of one adaptive algorithm is $\beta^2$. The number of whole adaptive algorithms is $$1+\beta+\beta^2+\ldots+\beta^{\alpha-1} = \frac{1-\beta^\alpha}{1-\beta}.$$

The whole calculation complexity, according to the LMS algorithm, is equal to $$\frac{(1-\beta^\alpha)\beta^2}{1-\beta} = O(\beta^{\alpha+1}) = O(N\beta).$$

Because of N is not less than β, the whole calculation complexity is O(Nβ) which is similar to that of RLS algorithm.

Figure 6A:
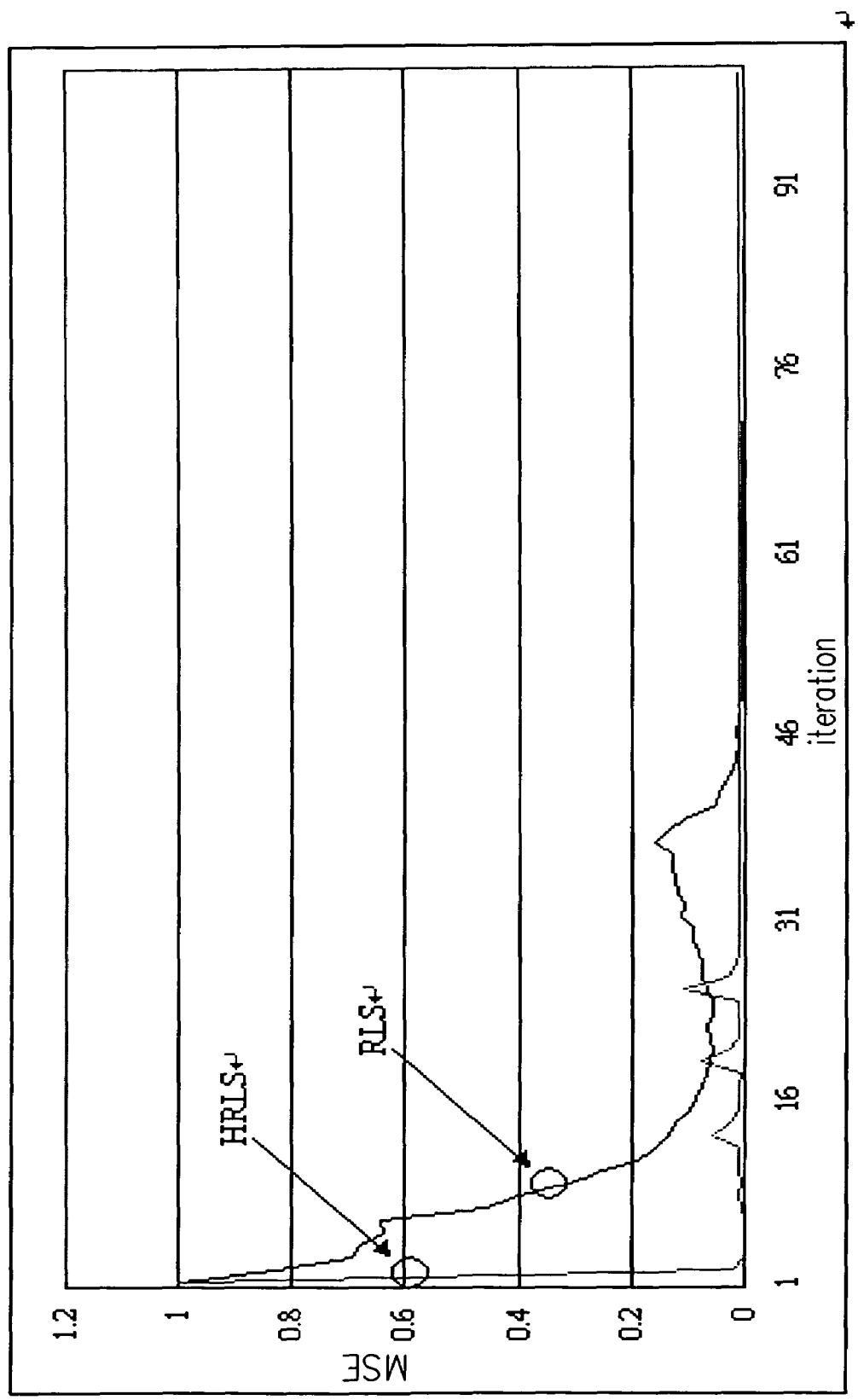
FIGS. 6A-6C are simulations of mean square error and convergent rate for HRLS algorithm according to the present invention.
Figure 6B:
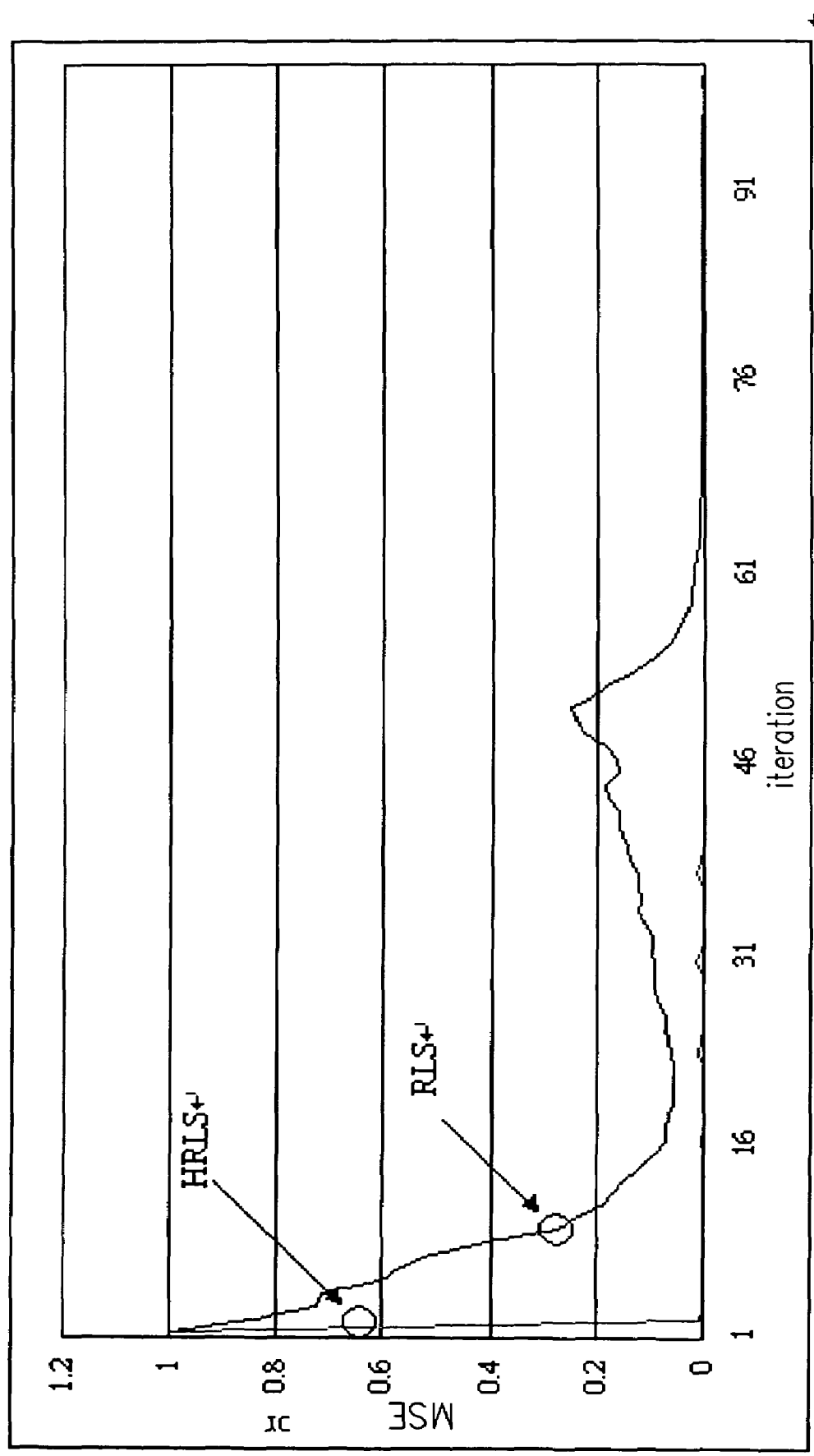
Figure 6C:
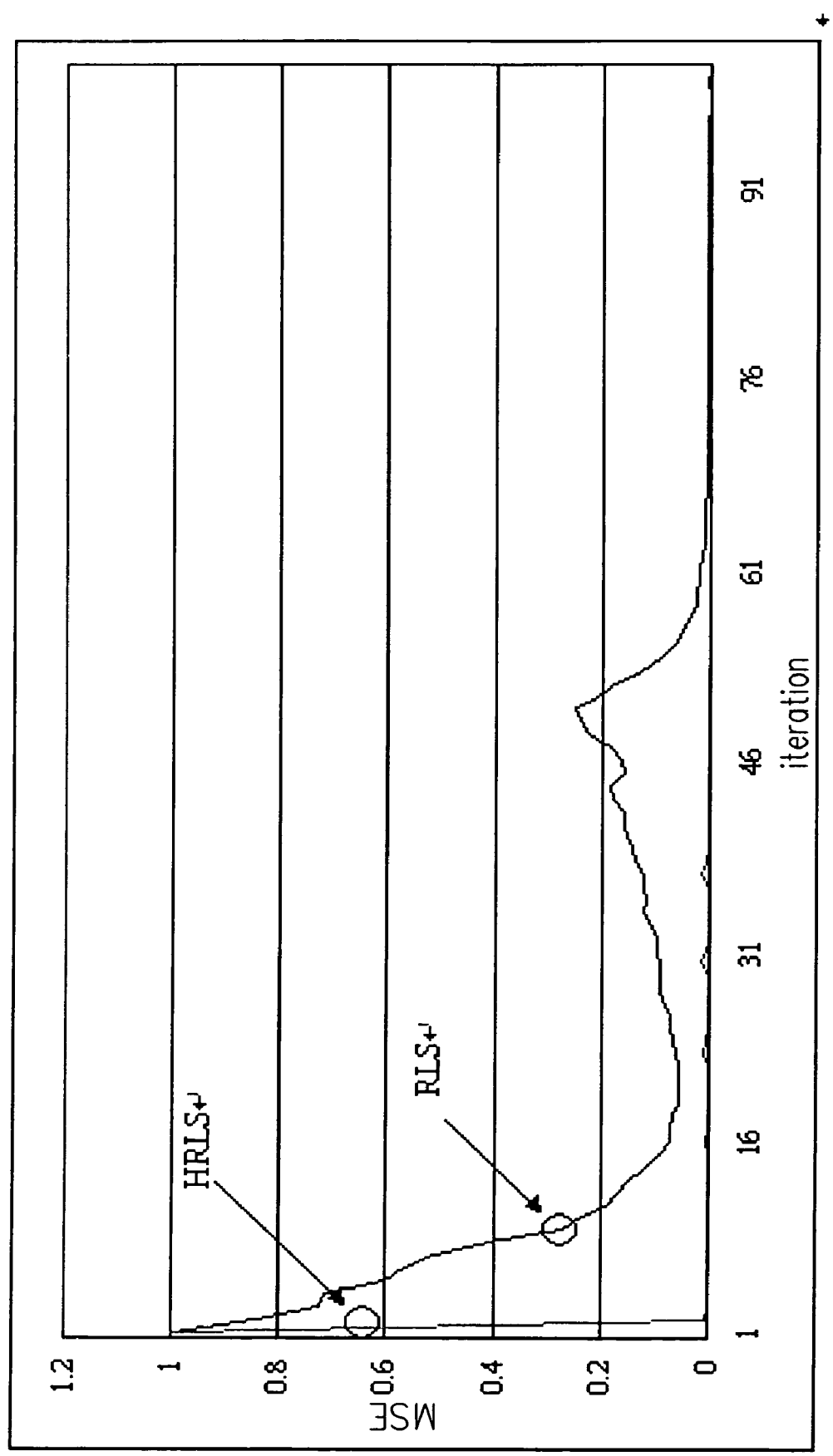

FIGS. 6A-6C are simulations of mean square error and convergent rate for HRLS algorithm according to the present invention. Under the HRLS algorithmic simulation, the equalizer comprises N input signals. The hierarchical tree comprises two levels (α=2). Each of the adaptive algorithms comprises $\sqrt{N}$ elements (β=$\sqrt{N}$). The frequency response is represented by the following equation:

$$h(k) = \frac{1}{2}[1 + \cos(2\pi(k-2)/W],$$

k=1,2,3,4 (it represents four multiple-route signals), W=2.9

During the simulations, the convergent rates and static mean square errors (MSE) of the LRS and HRLS are compared and shown in Table 2. N is equal to 16, 36 and 49. SNR is equal to 30 dB.

TABLE 2

|  | RLS | HRLS |
| --- | --- | --- |
| N = 16 | 0.001292 | 0.001055 |
| N = 36 | 0.001951 | 0.000836 |
| N = 49 | 0.002446 | 0.001103 |

Referring to FIGS. 6A-6C, HRLS algorithm has a higher convergent rate that that of LRS algorithm. During the static status, HRLS algorithm has a smaller mean square error that that of LRS shown in Table 2. Referring to FIG. 6A, HRLS algorithm has the highest convergent rate. When the number of elements is increased, the difference among HRLS and RLS are more obvious as shown in FIGS. 6B and 6C.

Following are the descriptions of the execution of Hierarchical Constant Modulus Algorithm (HCMA). Referring to FIG. 4, multiplying the first level input signal with the updated weighting generates first level sub-equalizer outputs. The first level sub-equalizer outputs serve as inputs of the second level sub-equalizer. An output from the second level sub-equalizer is equal to the real output of the equalizer. Through the minimized processing of the cost functions of HCMA, the convergent rate can be substantially improved. Because the HCMA and the cost function thereof can be simultaneously executed in static status, the processing time is, therefore, reduced.

In order to compare the local or global minimum difference between CMA and HCMA, CM cost surfaces of simulation CMA are used to calculate the difference of variations of three-dimension contours. The equation is shown as below:

$$J_{CM} = E\{(|y(k)|^2 - \gamma)^2\} = E\{|y(k)|^4\} - 2\gamma E\{|y(k)|^2\} + \gamma^2$$
$$= E\{|y(k)|^4\} - 2\sigma_s^2\kappa_s E\{|y(k)|^2\} + \sigma_s^4\kappa_s^2$$

$\kappa_s$ represents kurtosis of input signals $\{s(k)\}$; $\gamma$ represents dispersion constant of the input signals $\{s(k)\}$, wherein $$\kappa_s = \frac{E\{|s(k)|^4\}}{(E\{|s(k)|^2\})^2}; \gamma_s = \frac{E\{|s(k)|^4\}}{E\{|s(k)|^2\}};$$
$$\sigma_s^2 = \frac{\gamma}{\kappa_s}; y(k) = G^T s(k); G = wC.$$

In this embodiment, the present invention uses an equalizer with four input taps to perform the simulation. The weighting vector of CMA is:

$w_{CMA}(k)$=[$w_1(k)$, $w_2(k)$, $w_3(k)$, $w_4(k)$]. The weighting vector of HCMA is:

$w_{HCMA}(k)$=($w_1^1(k)$+$w_2^1(k)$)$w_1^2(k)$, wherein $w_1^1(k)$= [$w_{11}^1(k)$, $w_{12}^1(k)$];

$w_2^1(k)$=[$w_{21}^1(k)$, $w_{22}^1(k)$]; $w_1^2(k)$=[$w_{11}^2(k)$, $w_{12}^2(k)$].

When the second level weighting vector $w_1^2(k)$ is applied to the first level weighting vector, the weighting vector of HCMA is shown as below:

$w_{HCMA}(k)$=($w_{11}^1(k)w_{11}^2(k)$, $w_{12}^1(k)w_{11}^2(k)$, $w_{21}^1(k)$ $w_{12}^2(k)$, $w_{22}^1(k)w_{12}^2(k)$).

Then channel coefficient vector C=[$c_0,c_1,c_2,\ldots,c_{2M-1}$]$^T$ is applied thereto, and the cost surface formula becomes as below:

$$J_{CM}(w_{HCMA}) = \sigma_s^4(\kappa_s - 3)\sum_{i=1}^{7} e_i^4 + 3\sigma_s^4\|G\|_2^4 + \sigma_w^2(\kappa_w - 3)\sum_{i=1}^{4} w_i^4 +$$
$$3\sigma_w^4\|w\|_2^4 + 6\sigma_s^2\sigma_w^2\|G\|_2^2\|w\|_2^2 - 2\sigma_s^2 K_s(\sigma_s^2\|G\|_2^2 + \sigma_w^2\|w\|_2^2) + \sigma_s^4\kappa_s^2$$

When the first level weighting vectors are $w_1^1(k)=[w_{11}^1(k), w_{12}^1(k)]$ and $w_2^1(k)=[w_{21}^1(k), w_{22}^1(k)]$, the cost surface formula becomes $J_{CM}(w_{HCMA})=J_{CM}(w_{11}^2, w_{12}^2)$. For BPSK, $\sigma_s^4$ and $\kappa_s$ are equal to 1; Gauss noise $\kappa_w$ is equal to 3. The CM cost surface formula of HCMA becomes as below:

$$J_{CM}(w_{11}^2, w_{12}^2) = -2\sum_{i=1}^{7} e_i^4 + 3\|G\|_2^4 + \sigma_w^2(\kappa_w - 3)\sum_{i=1}^{4} w_i^4 +$$
$$3\sigma_w^4\|w\|_2^4 + 6\sigma_w^2\|G\|_2^2\|w\|_2^2 - 2(\|G\|_2^2 + \sigma_w^2\|w\|_2^2) + 1$$

FIGS. 7A-7D are simulations of CM cost surface formula and convergent rate for according to the present invention. For HCMA simulation, Fractionally-Spaced Model is applied. Channel pulse response factors are 0.2, 0.5, 1.0, and −0.1. The length of the equalizer is 64. SNR is equal to 50 dB.

Referring to FIGS. 7A-7D, the convergent rate of cost function of HCMA is higher than that of the CMA. After 500-time iterations, the cost function of HCMA is converged.

Figure 7A:
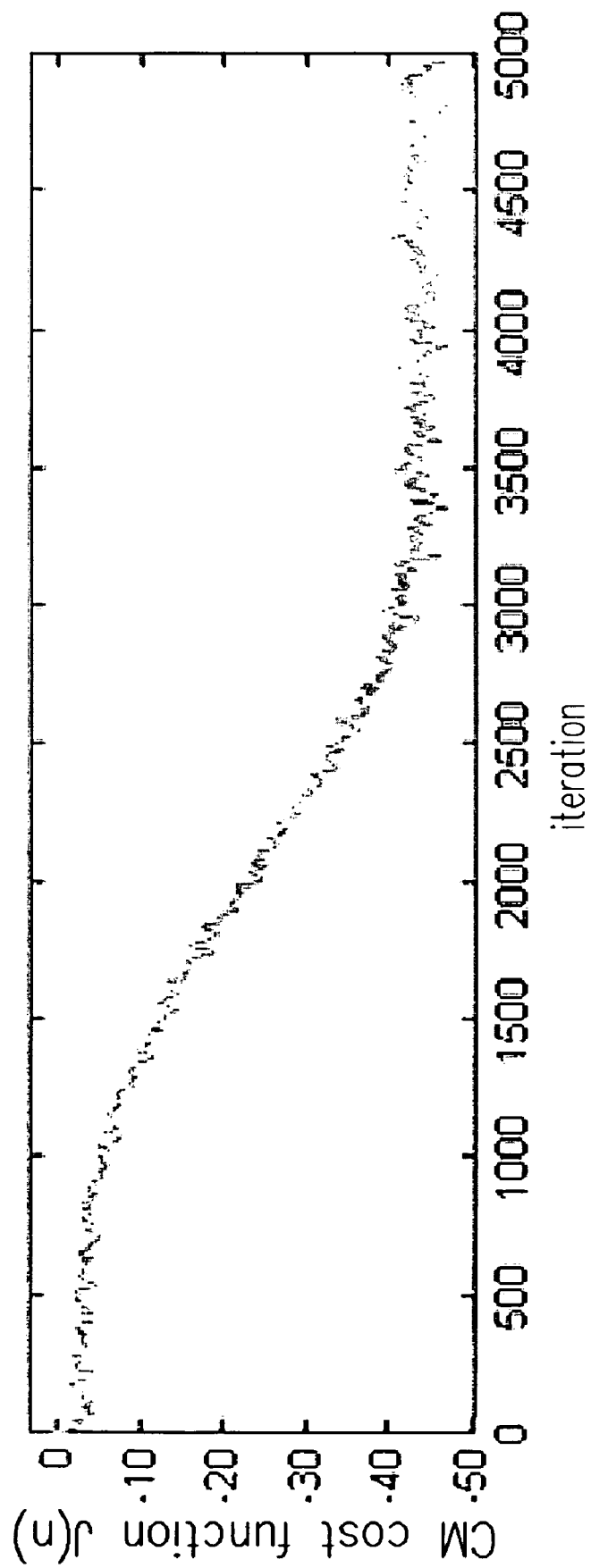
FIGS. 7A-7D are simulations of CM cost function and convergent rate according to the present invention.
Figure 7B:
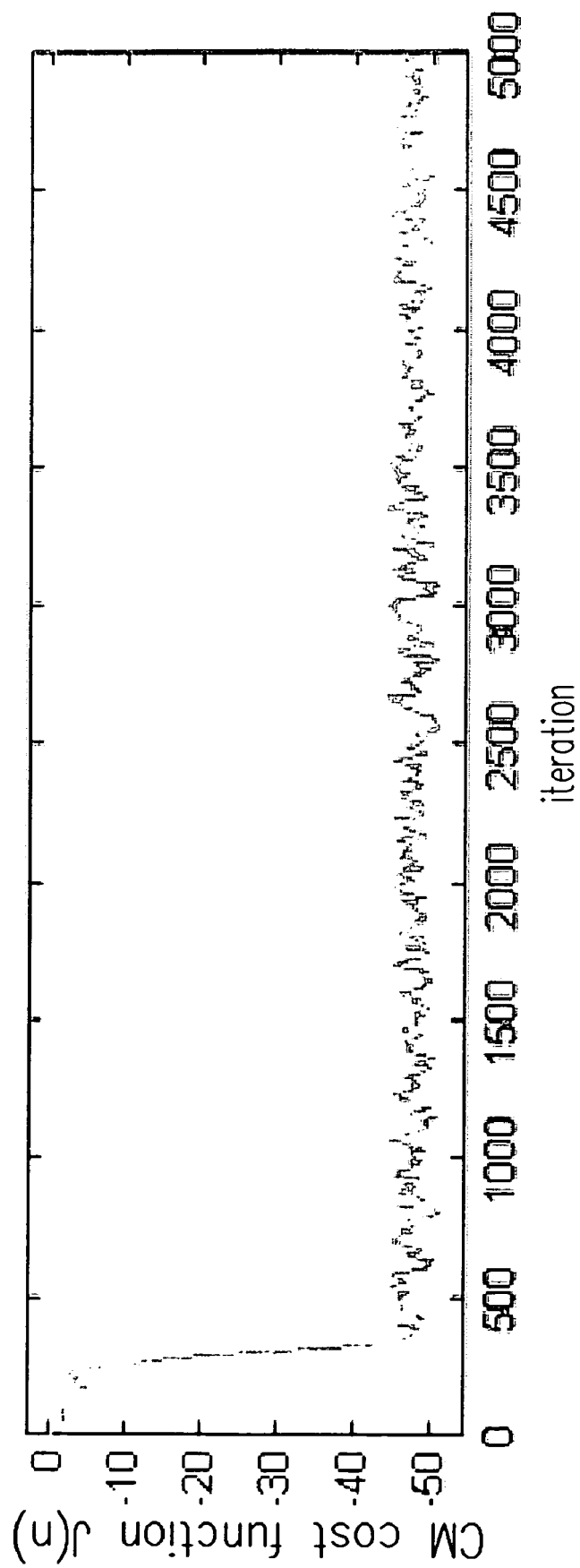
Figure 7C:
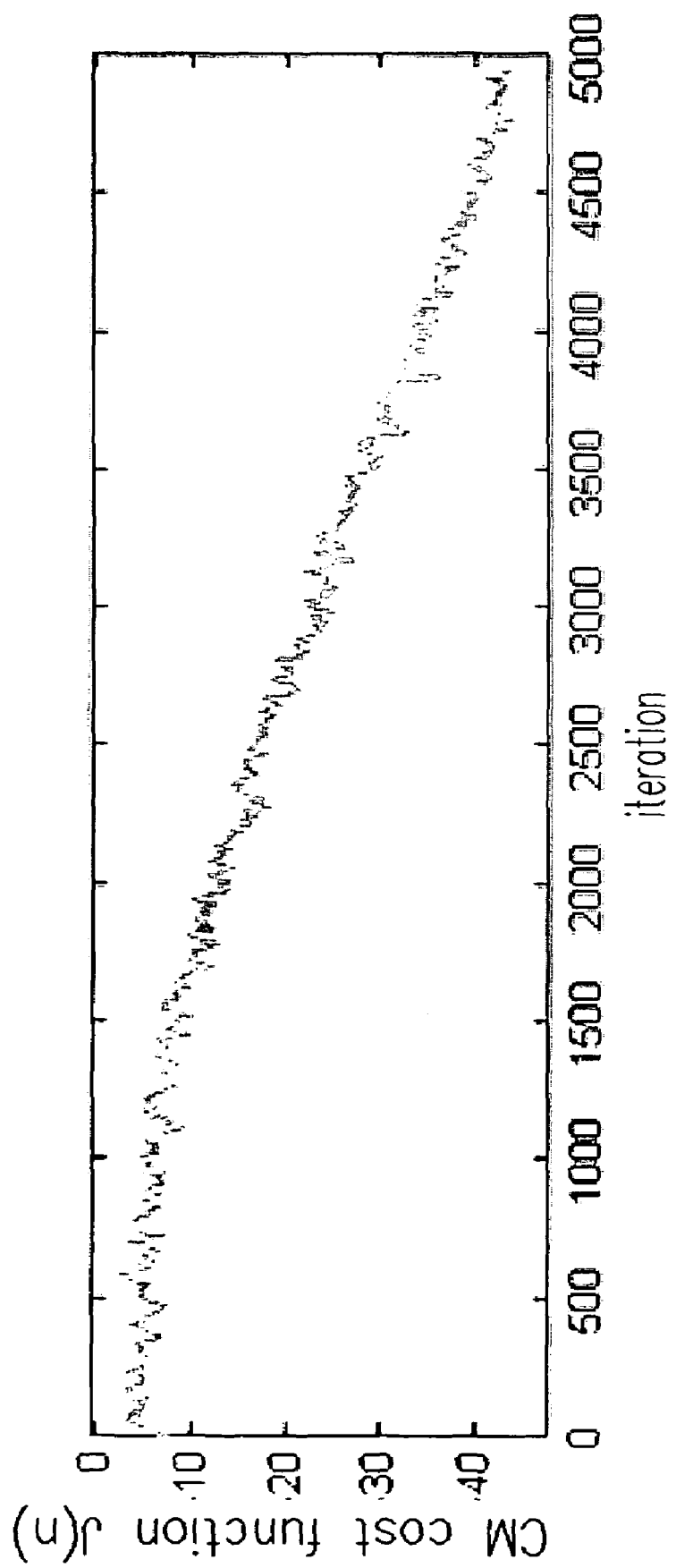
Figure 7D:
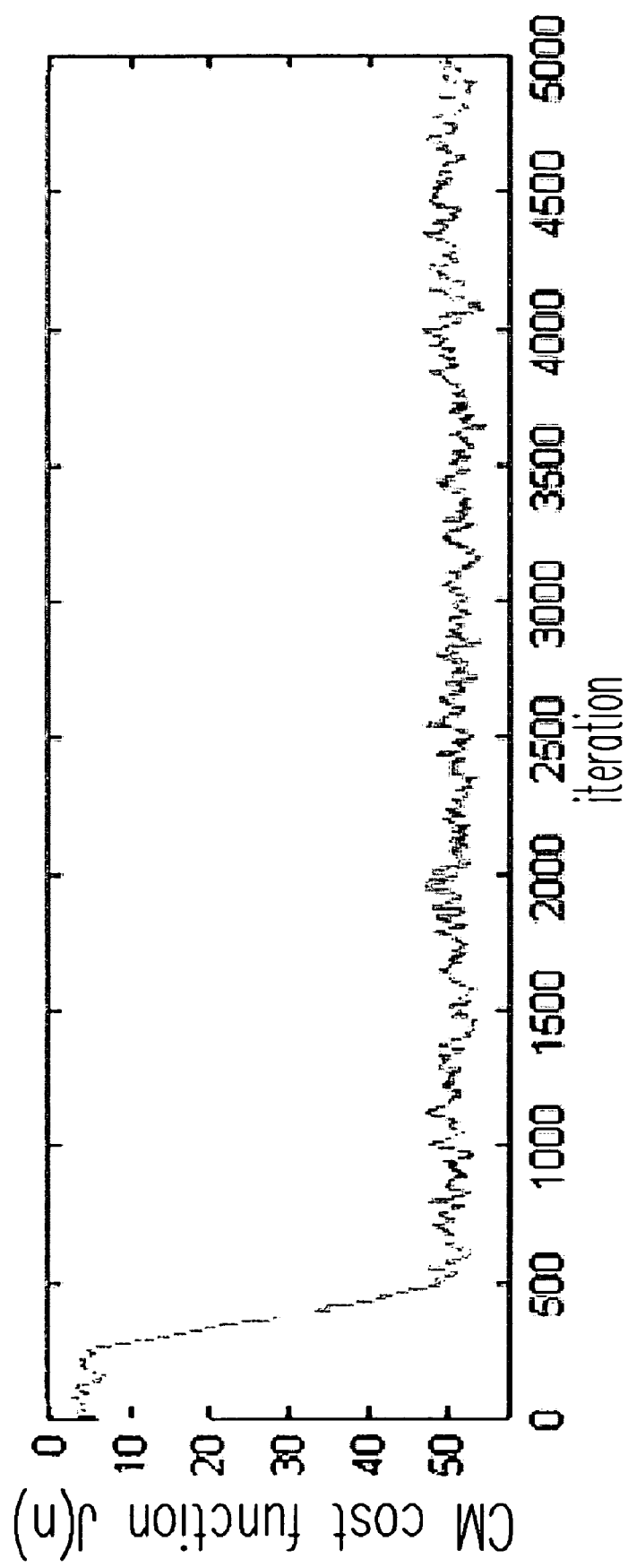
Figure 7E:
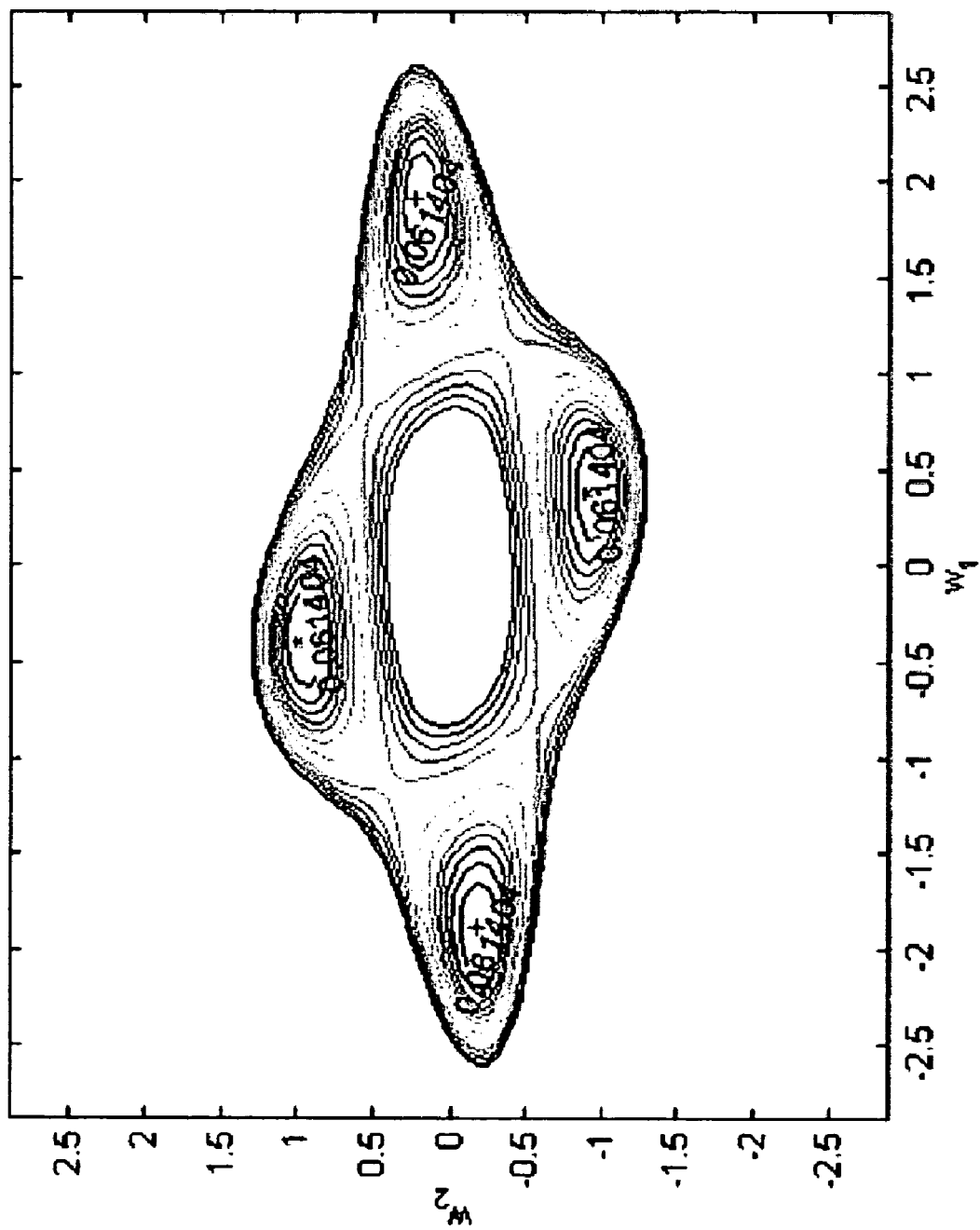
FIG. 7E is a contour of CM after a standard CMA is in stable convergence according to the present invention.

FIG. 7E is a contour of CM of CMA with two taps after convergence according to the present invention. CMA is characterized in comprising a plurality of local minimums. Referring to FIG. 7E, standard CMA comprises four local minimums, wherein the number of 0.061404 represents the core contour lines. The symbols * and + in this figure represent the local minimums. Since the four local minimums have the same value, they are also called Global Minimum. Due to the good channel environment for the simulation, the four local areas are converged to the same preferred values.

Figure 8:
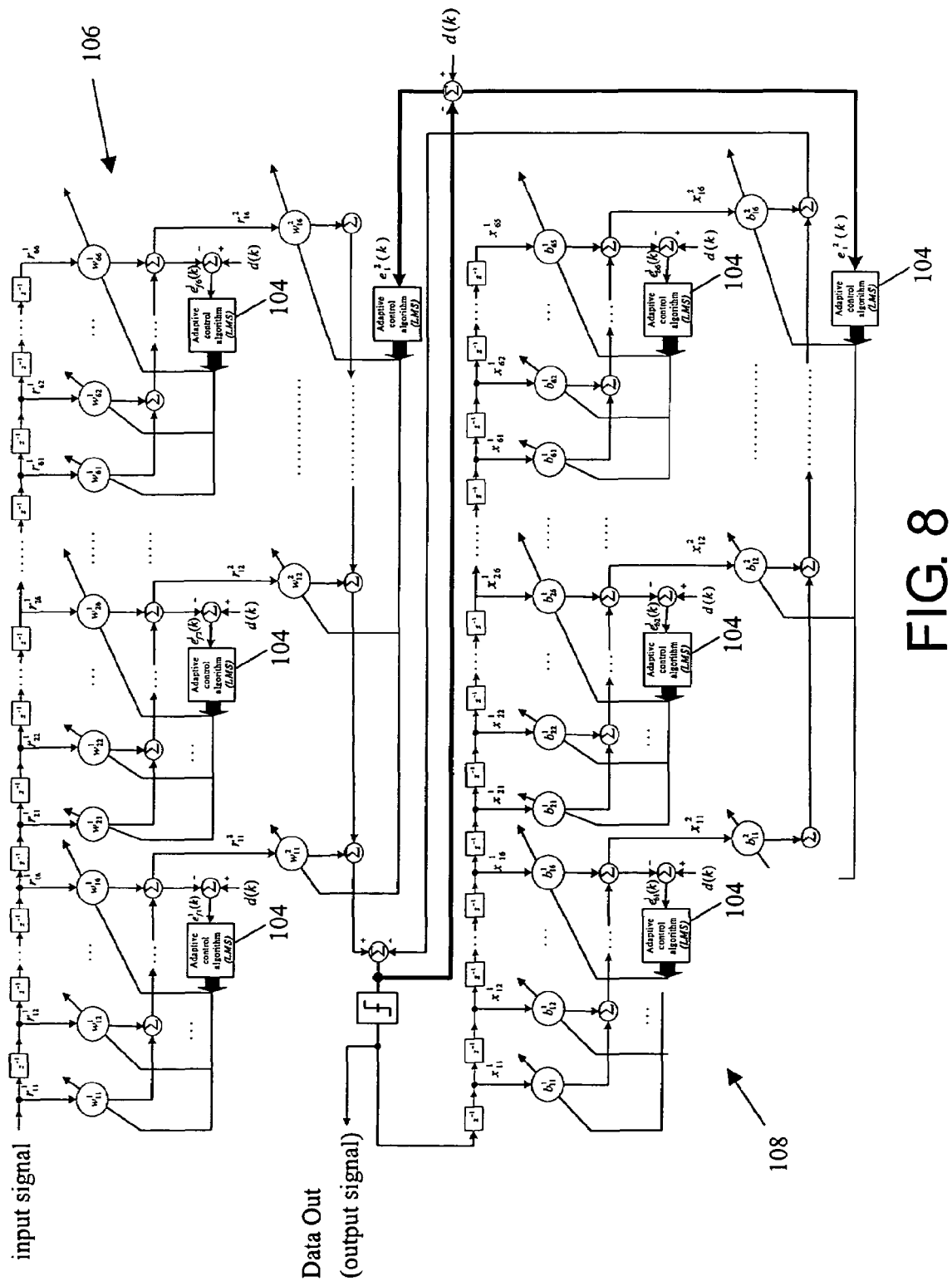
FIG. 8 is a detail structure of a DFE-HLMS adaptive equalizer according to an embodiment of the present invention.

FIG. 8 is a detail structure of a DFE-HLMS adaptive equalizer according to an embodiment of the present invention. In this embodiment, DFE algorithm comprises the operations of two linear filters 106 and 108. By little modification in updating weightings, the execution of DFE algorithm is similar to that of linear algorithm. Hierarchical DFE algorithm comprises the operations of two hierarchical linear filters 106 and 108. In such operations, Data Out is applied to update the second level weightings because the output of the second level is the real output of the two-level hierarchical equalizer. As a result, the whole execution of hierarchical DFE algorithm can be performed by little modification in updating weightings and by properly reducing the length of the feedback filter 108. A non-blind equalizer is an equalizer requiring training sequences. It is LMS and RLS algorithms that are related to such a non-blind equalizer.

Following are the descriptions of the weighting mechanism of DFE-LMS algorithm. The output of DFE-LMS algorithm is as below:

Data Out: $w^H(k)r(k)-b^H(k)x(k)$
MSE: $e(k)=d(k)-$Data Out
Updated weighting: $w(k+1)=w(k)+\mu_f r(k)e^*(k)$;

$b(k+1)=b(k)+\mu_b x(k)e^*(k)$ $w(k)$ and $b(k)$ represent the weighting vectors of the feed-forward filter 106 and the feedback filter 108, respectively; $r(k)$ and $x(k)$ represent input signals thereof, respectively; $\mu_f$ and $\mu_b$ represent step sizes thereof, respectively.

Referring to FIG. 8, the DFE-HLMS adaptive equalizer comprises two hierarchical filter sets, a feed-forward filter set 106 and a feedback filter set 108. Each of the filter sets is similar to the HLMS structure. According to the hierarchical structure and the design method thereof, one filter set allocates input signals to several adaptive algorithms. Each of the adaptive algorithms is deemed as a sub-filter. These sub-filters constitute the hierarchical filter set. Every first-level sub-filter of the two-level filter set has its own updated weighting.

The second-level weighting of the second-level sub-filter is generated from errors e(k) by d(k) minus Data Out. In addition, the length of the feedback filter set 108 is shorter than that of the feed-forward filter set 106. In this embodiment, the length of the feedback filter set 108 is shorter than that of the feed-forward filter set 106 by 1. But both filter sets 106 and 108 have the same number of adaptive algorithms 104. The updated weighting mechanism of DFE-HLMS is described as below:

(1) the updated weightings for each of first-level sub-filters of the feed-forward filter set 106:
MSE: $e_{fi}^1(k)=d(k)-w_i^{1H}(k)r_i^1(k)\circ$
Updated weighting: $w_i^1(k+1)=w_i^1(k)+\mu_f r_i^1(k)e_{fi}^{1*}(k)$ for the feedback filter set 108:
MSE: $e_{bi}^1(k)=d(k)-b_i^{1H}(k)x_i^1(k)\circ$
Updated weighting: $b_i^1(k+1)=b_i^1(k)+\mu_b x_i^1(k)e_{bi}^{1*}(k)$ (2) Because the real output of the hierarchical structure is the output of the bottom level, the output of the DFE-HLMS equalizer is:
Data Out: $y_1^2(k)=w_1^{2H}(k)r_1^2(k)-b_1^{2H}(k)x_1^2(k)$
MSE: $e_1^2(k)=d(k)-$Data Out
Updated weighting for the feed-forward filter set 106:

$$w_1^2(k+1)=w_1^2(k)+\mu_f r_1^2(k)e_1^{2*}(k)$$

Updated weighting for the feedback filter set 108:

$$b_1^2(k+1)=b_1^2(k)+\mu_b x_1^2(k)e_1^{2*}(k)$$

$w_i^1(k)$ and $r_i^1(k)$ represent the weighting and input signal vectors of the ith adaptive algorithm of the first level after the kth iteration of the feed-forward filter set 106, respectively. $b_i^1(k)$ and $x_i^1(k)$ represent weighting and input signal vectors of the ith adaptive algorithm of the first level after the kth iteration of the feedback filter set 108, respectively. $w_1^{2H}(k)r_1^2(k)$ represents the output of the second level of the feed-forward filter set 106. $b_1^{2H}(k)x_1^2(k)$ represents the output of the second level of the feedback filter set 108. $r_1^2(k)$ and $x_1^2(k)$ represent the input signal vectors for the second level, i.e. the output signal of the first level, of the two filter sets 106 and 108, respectively, wherein $r_1^2(k)=[r_{11}^2(k),r_{12}^2(k), \ldots ,r_{1\bar{N}}^2(k)]$; $x_1^2(k)=[x_{11}^2(k),r_{12}^2(k), \ldots ,r_{1\bar{N}}^2(k)]$. The input signal vectors of the second level result from multiplying the input signal vectors with the updated weighting vectors.

$r_{1i}^2(k)=w_i^{1H}(k+1)r_i^1(k), (w_i^1(k+1)=[w_{i1}^1(k+1), w_{i2}^1(k+1), \ldots, w_{i\bar{N}}^1(k+1)], r_i^1(k)=[r_{i1}^1(k), r_{i2}^1(k), \ldots, r_{i\bar{N}}^1(k)])$;

$x_{1i}^2(k)=b_i^{1H}(k+1)x_i^1(k), (b_i^1(k+1)=[b_{i1}^1(k+1), b_{i2}^1(k+1), \ldots, b_{i\bar{N}}^1(k+1)], x_i^1(k)=[x_{i1}^1(k), x_{i2}^1(k), \ldots, x_{i\bar{N}-1}^1(k)])$ In this embodiment, Data Out is the output of the DFE-HCMA equalizer, wherein Data Out is equal to $y_1^2 \cdot e_{fi}^1(k)$ and $e_{bi}^1(k)$ represent the MSE of the ith adaptive algorithms of the first levels of the feed-forward filter set 106 and feedback filter set 108, respectively. $\mu_f$ and $\mu_b$ represent step sizes thereof. Data Out is the output of the DFE-HCMA equalizer.

$e_1^2(k)$ represents the MSE of the second level and is the real MSE of the DFE-HCMA equalizer. $w_1^2(k)$ and $b_1^2(k)$ represent the second-level weighting vectors of the feed-forward filter set 106 and feedback filter set 108, respectively.

In this embodiment, DFE-HLMS algorithm simulation has following assumptions: (1) the equalizer has N input signals; and (2) the feed-forward filter set 106 and the feedback filter set 108 comprise two-level processing ($\alpha=2$). Every adaptive algorithm 104 of the feed-forward filter set 106 comprises $\sqrt{N}$ signals ($\beta=\sqrt{N}$). Except of the last adaptive algorithm of the first level of the feedback filter set 108, each of the other adaptive algorithms 104 of the feedback filter set 108 comprises $\sqrt{N}$ signals. The length of the last adaptive algorithm 104 is $\sqrt{N}-1$. In this embodiment, the frequency response is represented by the following equation:

$$h(k) = \frac{1}{2}[1 + \cos(2\pi(k-2)/W)],$$

k=1,2,3,4 (it represents four multiple-route signals), W=3.1

The length N of the DFE equalizer is equal to 64, 100 and 121. SNR is equal to 30 dB.

Figure 9A:
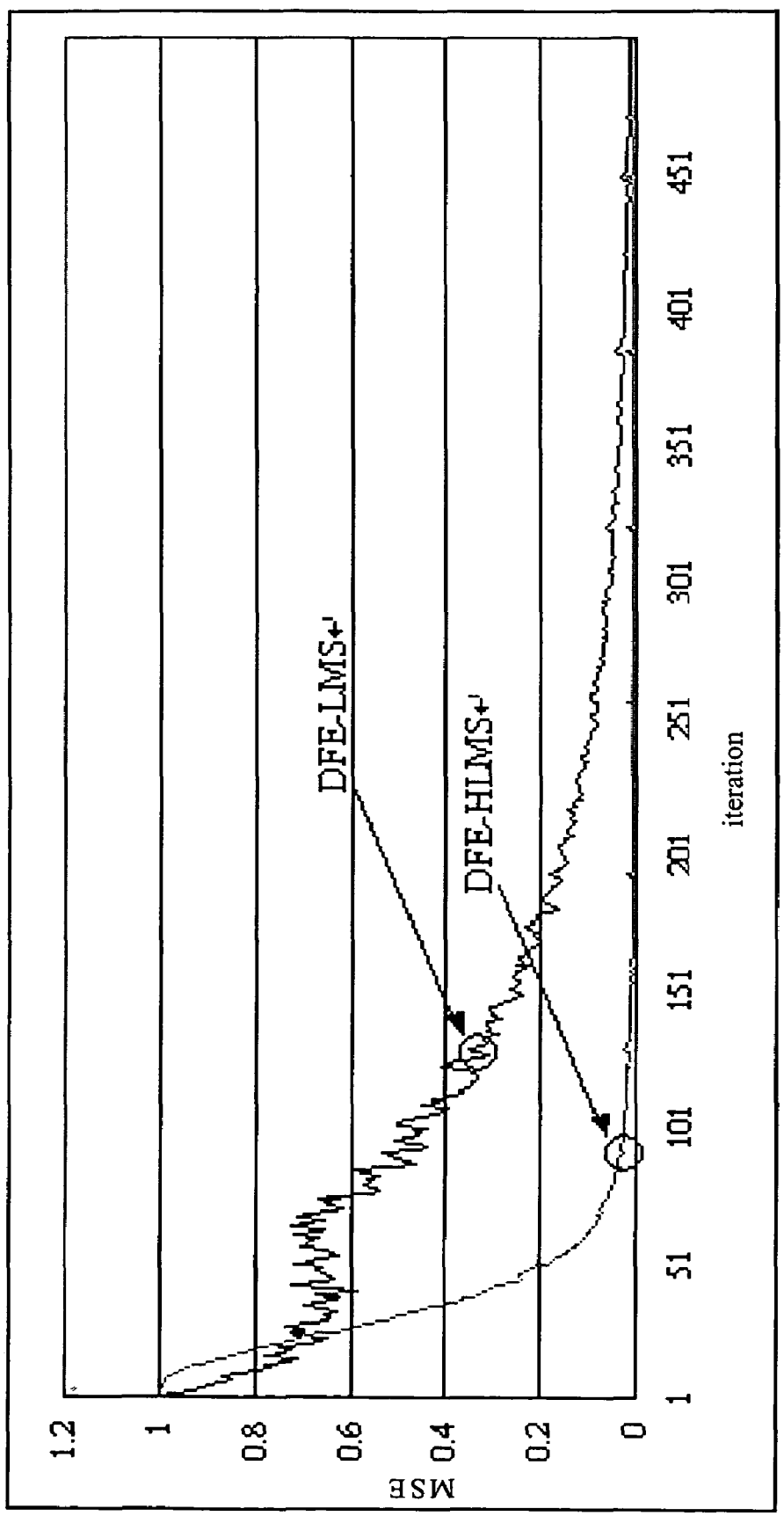
FIGS. 9A-9C are simulations of MSE and convergent rate of DFE-HLMS algorithm according to the present invention.
Figure 9B:
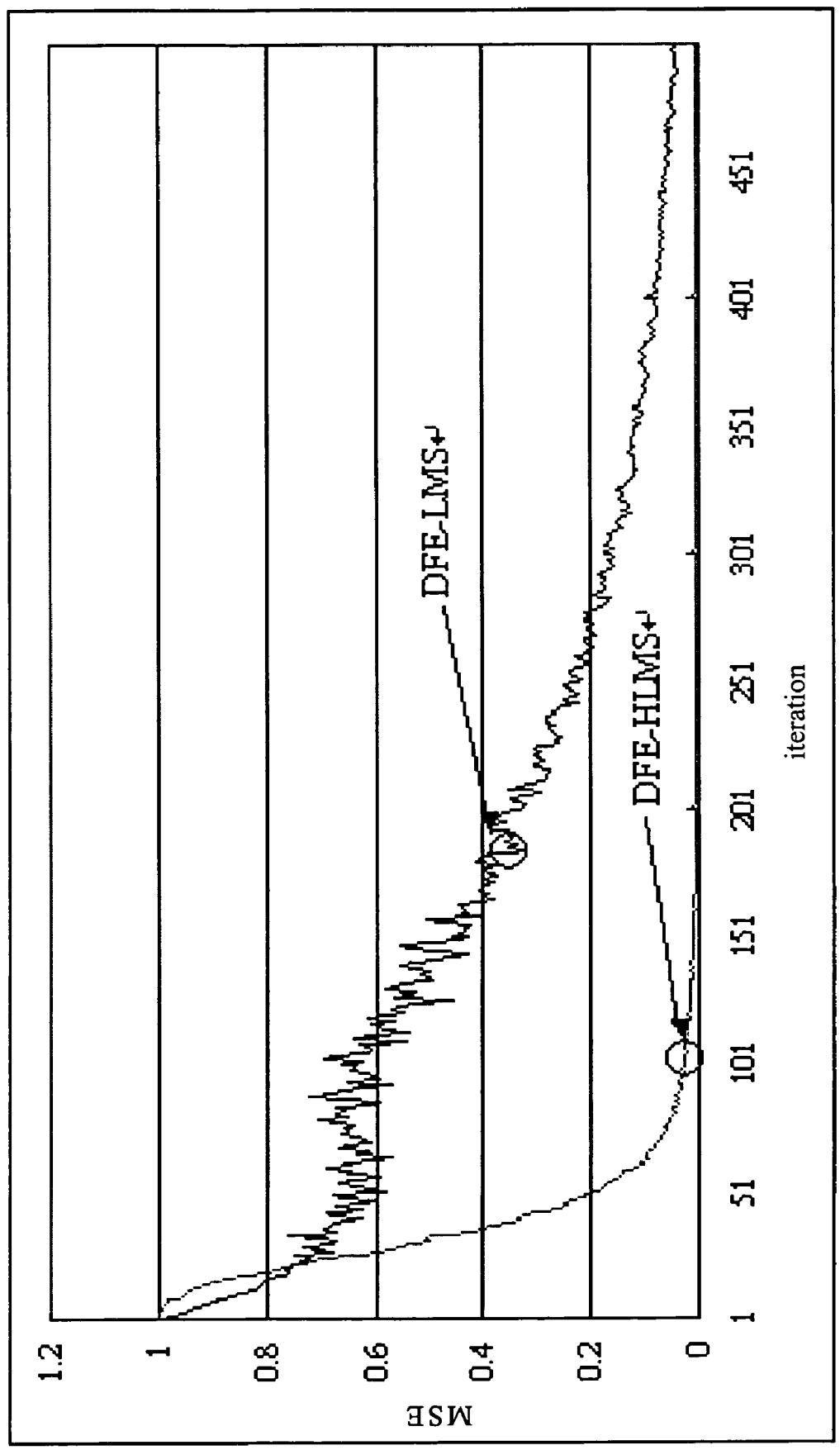
Figure 9C:
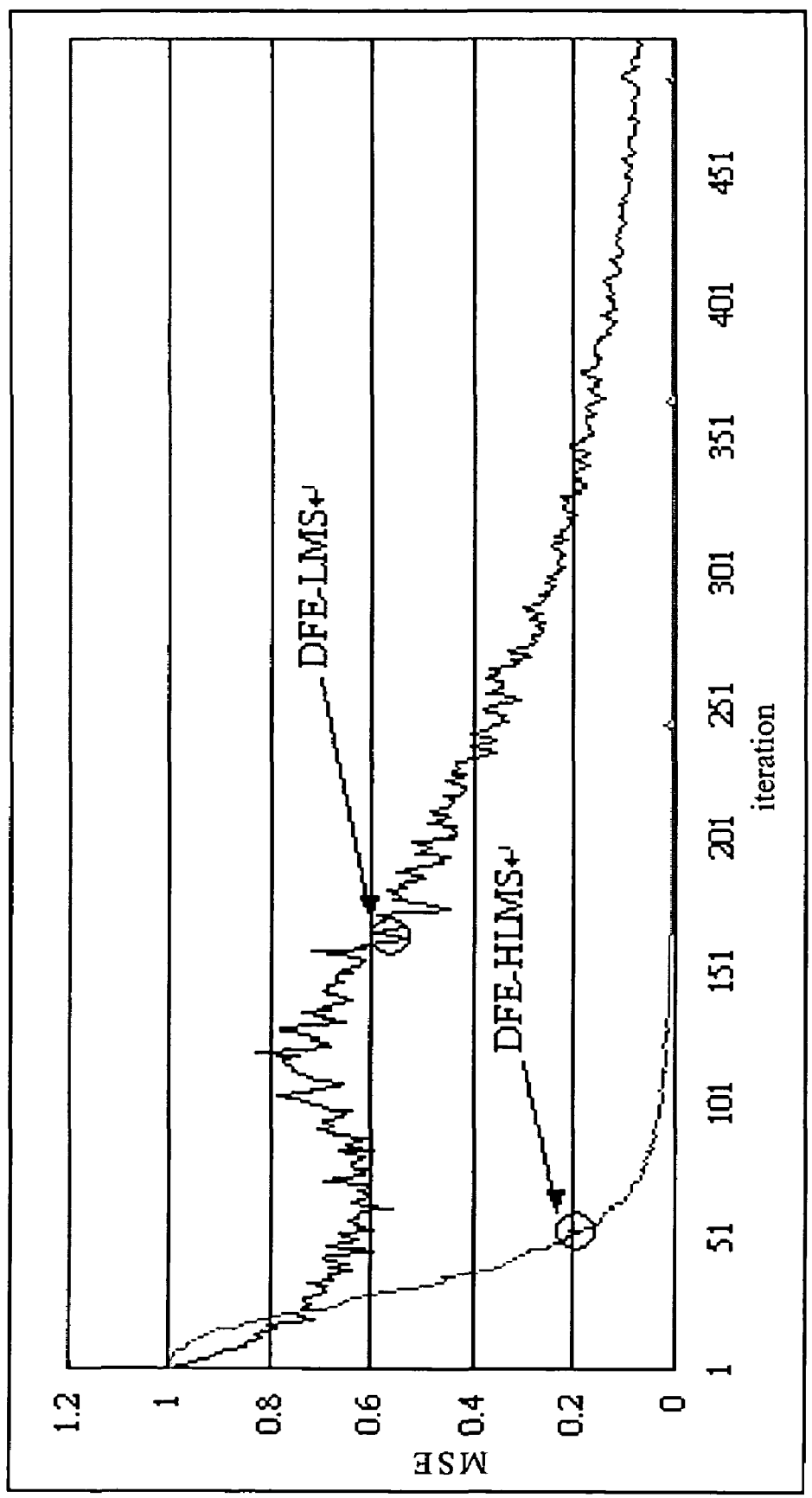

FIGS. 9A-9C are simulations of MSE and convergent rate of DFE-HLMS algorithm according to the present invention. Referring to FIGS. 9A-9C, DFE-HLMS algorithm has higher convergent rate. During the static status, DFE-HLMS algorithm has a smaller mean square error than that of DFE-LMS algorithm shown in Table 3. According to the hierarchical structure and design thereof, the hierarchical structure does enhance the convergent rate of DFE-LMS algorithm.

TABLE 3

|  | DFE-LMS | DFE-HLMS |
| --- | --- | --- |
| N = 64 | 0.01228 | 0.003761 |
| N = 100 | 0.044886 | 0.003215 |
| N = 121 | 0.082037 | 0.004316 |

According to CMA algorithm, the updated weighting mechanism of the feed-forward filter set 106 and the feedback filter set 108 of DFE-CMA algorithm is described as below:

Data Out: $y(k)=w^H(k)r(k)-b^H(k)x(k)$

Cost function: $e(k)=y^*(k)(1-|y(k)|^2)$

Updated weighting:

For feed-forward filter set: $w(k+1)=w(k)+\mu_f r(k)e(k)$

For feedback filter set: $b(k+1)=b(k)+\mu_b x(k)e(k)$ $w(k)$ and $b(k)$ represent the weighting vectors of the feed-forward filter set 106 and the feedback filter set 108, respectively; $r(k)$ and $x(k)$ represent input signals thereof, respectively; $\mu_f$ and $\mu_b$ represent step sizes thereof, respectively.

Figure 10:
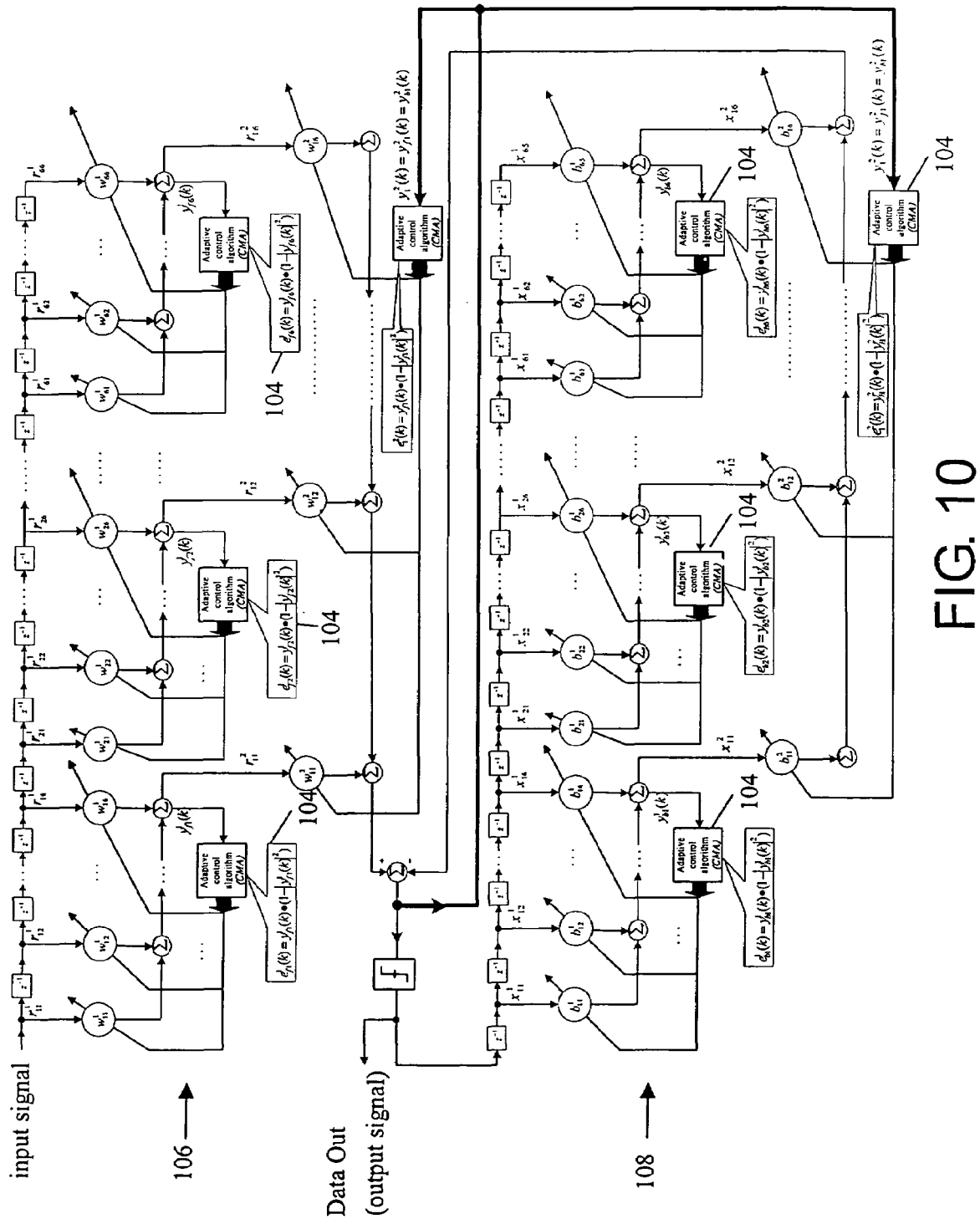
FIG. 10 is a detail structure of a DFE-HCMA adaptive equalizer according to an embodiment of the present invention.

FIG. 10 is a detail structure of a DFE-HCMA adaptive equalizer according to an embodiment of the present invention. The design of DFE-HCMA adaptive equalizer is similar to that of DFE-HLMS adaptive equalizer. Different between the two adaptive equalizers is the weighting of algorithm. Detailed descriptions are not repeated. Following are the descriptions of the updated weighting mechanism of DFE-HCMA adaptive equalizer.

Following are the data of the sub-filter of the first level of the feed-forward filter set 106:

Output of the sub-filter: $y_{fi}^1(k)=w_i^{1H}(k)r_i^1(k)$

Cost function: $e_{fi}^1(k)=y_{fi}^1(k)(1-|y_{fi}^1(k)|^2)$

Updated weighting: $w_i^1(k+1)=w_i^1(k)+\mu_f r_i^1(k)e_{fi}^1(k)$

Following are the data of the sub-filter of the first level of the feedback filter set 108:

Output of the sub-filter: $y_{bi}^1(k)=b_i^{1H}(k)x_i^1(k)$

Cost function: $e_{bi}^1(k)=y_{bi}^1(k)(1-|y_{bi}^1(k)|^2)$

Updated weighting: $b_i^1(k+1)=b_i^1(k)+\mu_b x_i^1(k)e_{fi}^1(k)$

The weighting of the second level is updated. Since the real output of the hierarchical equalizer is equal to the output of the bottom level, Data Output of the DFE-HCMA adaptive equalizer is as below:

$y_1^2(k)=w_1^{2H}(k)r_1^2(k)-b_1^{2H}(k)x_1^2(k)$, wherein $y_1^2(k)=y_{f1}^2(k)=y_{b1}^2(k)$ For the feed-forward filter set 106:

Cost function: $e_1^2(k)=y_{f1}^2(k)(1-|y_{f1}^2(k)|^2)$

Updated weighting: $w_1^2(k+1)=w_1^2(k)+\mu_f r_1^2(k)e_1^2(k)$

For the feedback filter set 108:

Cost function: $e_1^2(k)=y_{b1}^2(k)(1-|y_{b1}^2(k)|^2)$

Updated weighting: $b_1^2(k+1)=b_1^2(k)+\mu_b x_1^2(k)e_1^2(k)$ $w_i^1(k)$ and $r_i^1(k)$ represent the weighting and input signal vectors of the ith adaptive algorithm of the first level after the kth iteration of the feed-forward filter set 106, respectively. $b_i^1(k)$ and $x_i^1(k)$ represent weighting and input signal vectors of the ith adaptive algorithm of the first level after the kth iteration of the feedback filter set 108, respectively. $w_1^{2H}(k)r_1^2(k)$ represents the output of the second level of the feed-forward filter set 106. $b_1^{2H}(k)x_1^2(k)$ represents the output of the second level of the feedback filter set 108. $r_1^2(k)$ and $x_1^2(k)$ represent the input signal vectors for the second level, i.e. the output signal of the first level, of the two filter sets 106 and 108, respectively, wherein $r_1^2(k)=\lfloor r_{11}^2(k), r_{12}^2(k), \ldots, r_{1\sqrt{N}}^2(k)\rfloor$; $x_1^2(k)=\lfloor x_{11}^2(k), x_{12}^2(k), \ldots, r_{1\sqrt{N}}^2(k)\rfloor$. The input signal vectors of the second level result from multiplying the input signal vectors with the updated weighting vectors.

$r_{1i}^2(k)=w_i^{1H}(k+1)r_i^1(k)$, $(w_i^1(k+1)=\lfloor w_{i1}^1(k+1), w_{i2}^1(k+1), \ldots, w_{i\sqrt{N}}^1(k+1)\rfloor$, $r_i^1(k)=\lfloor r_{i1}^1(k), r_{i2}^1(k), \ldots, r_{i\sqrt{N}}^1(k)\rfloor)$;

$x_{1i}^2(k)=b_i^{1H}(k+1)x_i^1(k)$, $(b_i^1(k+1)=\lfloor b_{i1}^1(k+1), b_{i2}^1(k+1), \ldots, b_{i\sqrt{N}-1}^1(k+1)\rfloor$, $x_i^1(k)=\lfloor x_{i1}^1(k), x_{i2}^1(k), \ldots, x_{i\sqrt{N}-1}^1(k)\rfloor)$ In this embodiment, Data Out is the output of the DFE-HCMA equalizer, wherein Data Out is equal to $y_1^2$. $e_{fi}^1(k)$ and $e_{bi}^1(k)$ represent the MSE of the ith adaptive algorithms of the first levels of the feed-forward filter set 106 and feedback filter set 108, respectively. $\mu_f$ and $\mu_b$ represent step sizes thereof. Data Out is the output of the DFE-HCMA equalizer. $e_1^2(k)$ represents the MSE of the second level and is the real MSE of the DFE-HCMA equalizer. $w_1^2(k)$ and $b_1^2(k)$ represent the second-level weighting vectors of the feed-forward filter set 106 and feedback filter set 108, respectively.

Figure 11A:
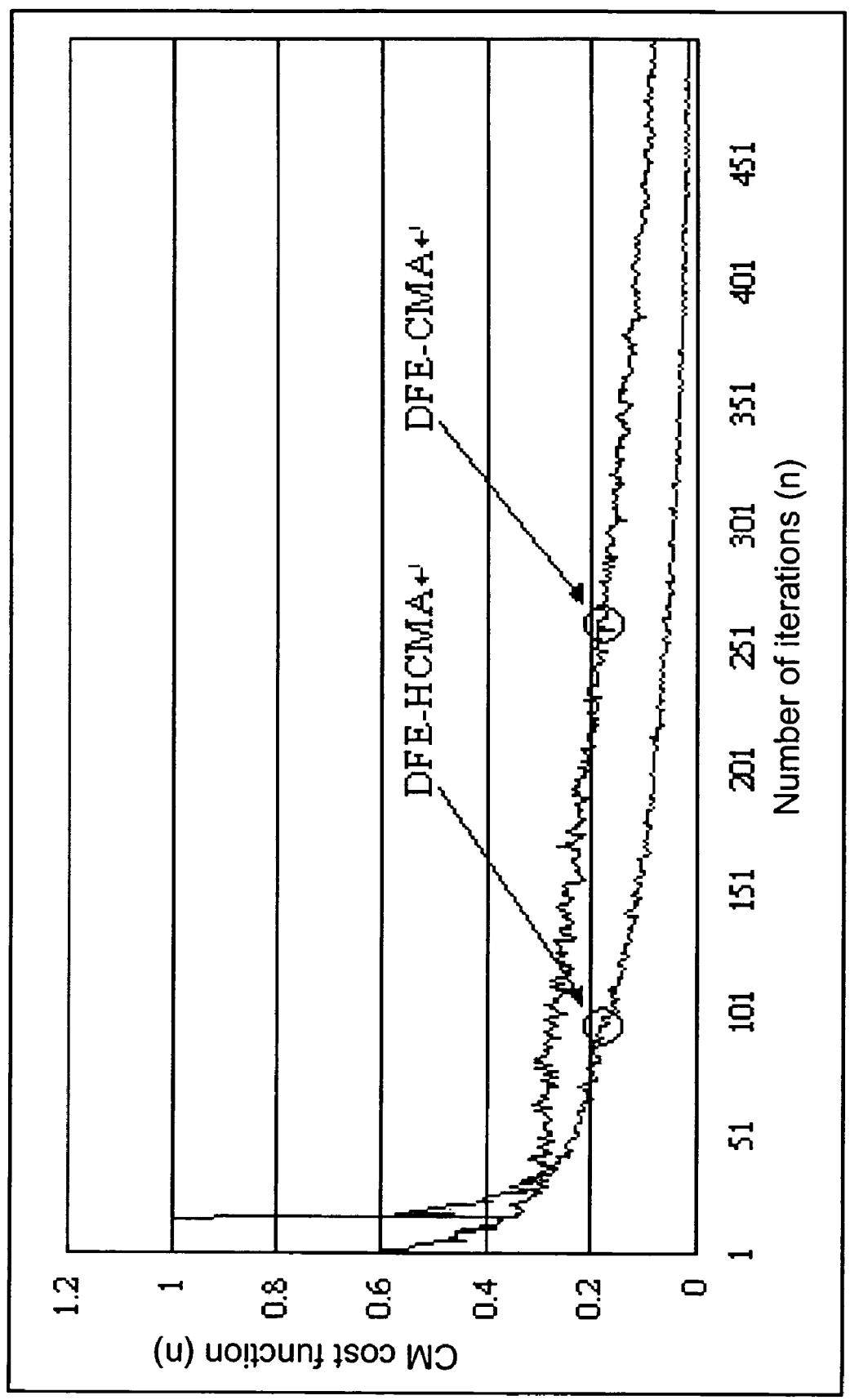
FIGS. 11A-11C are simulations of CM cost surface formula and convergent rate for according to the present invention.
Figure 11B:
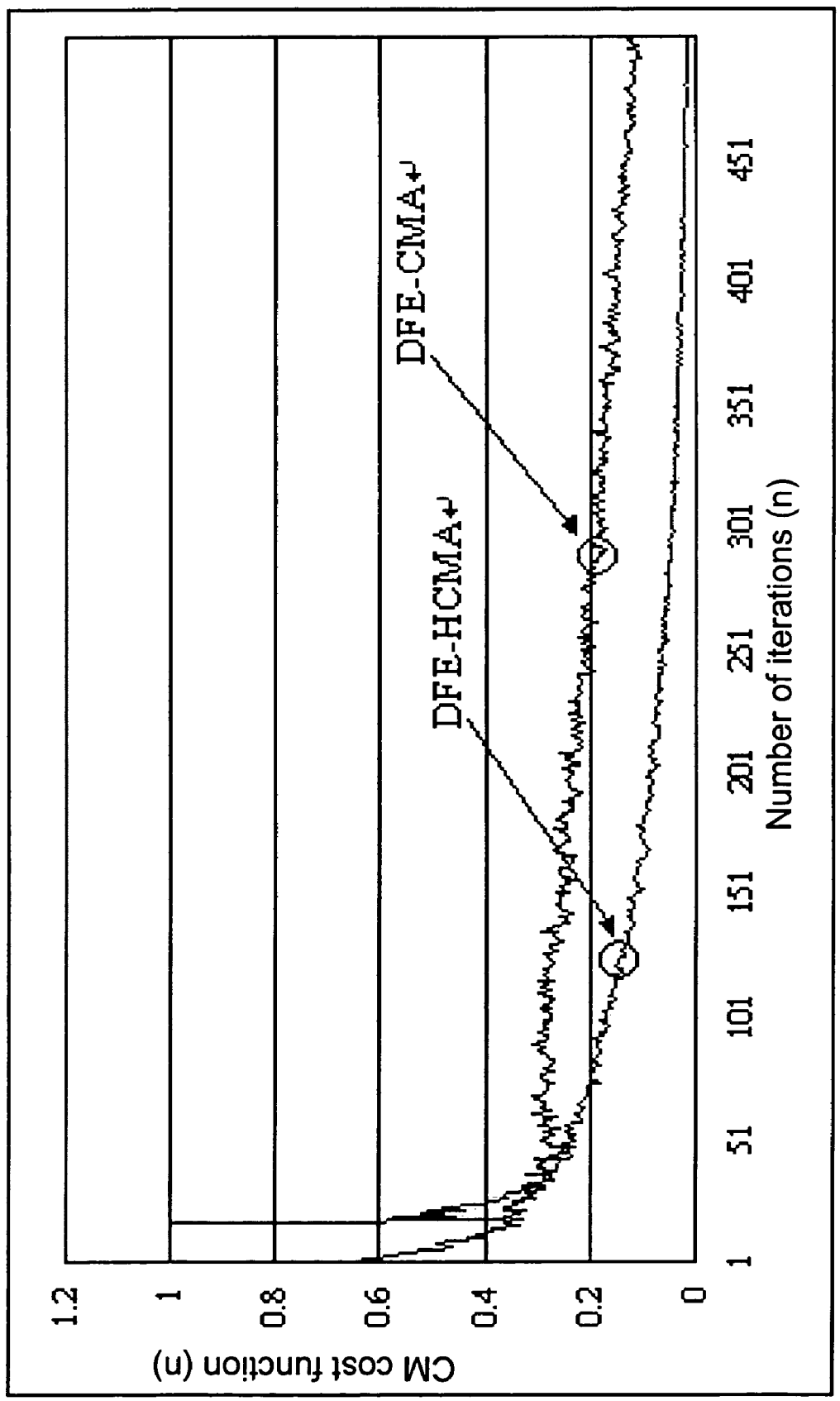
Figure 11C:
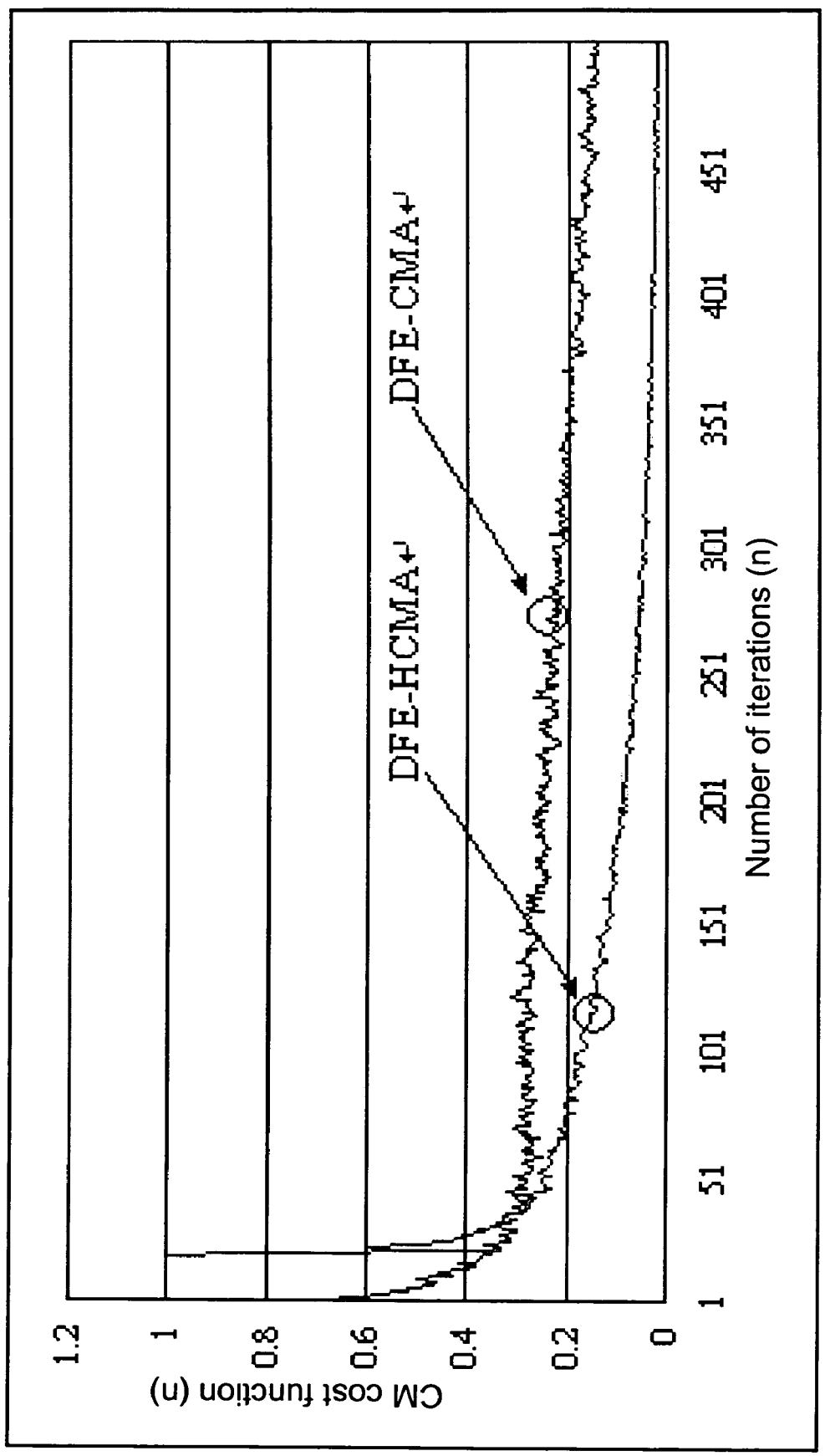
Figure 12:
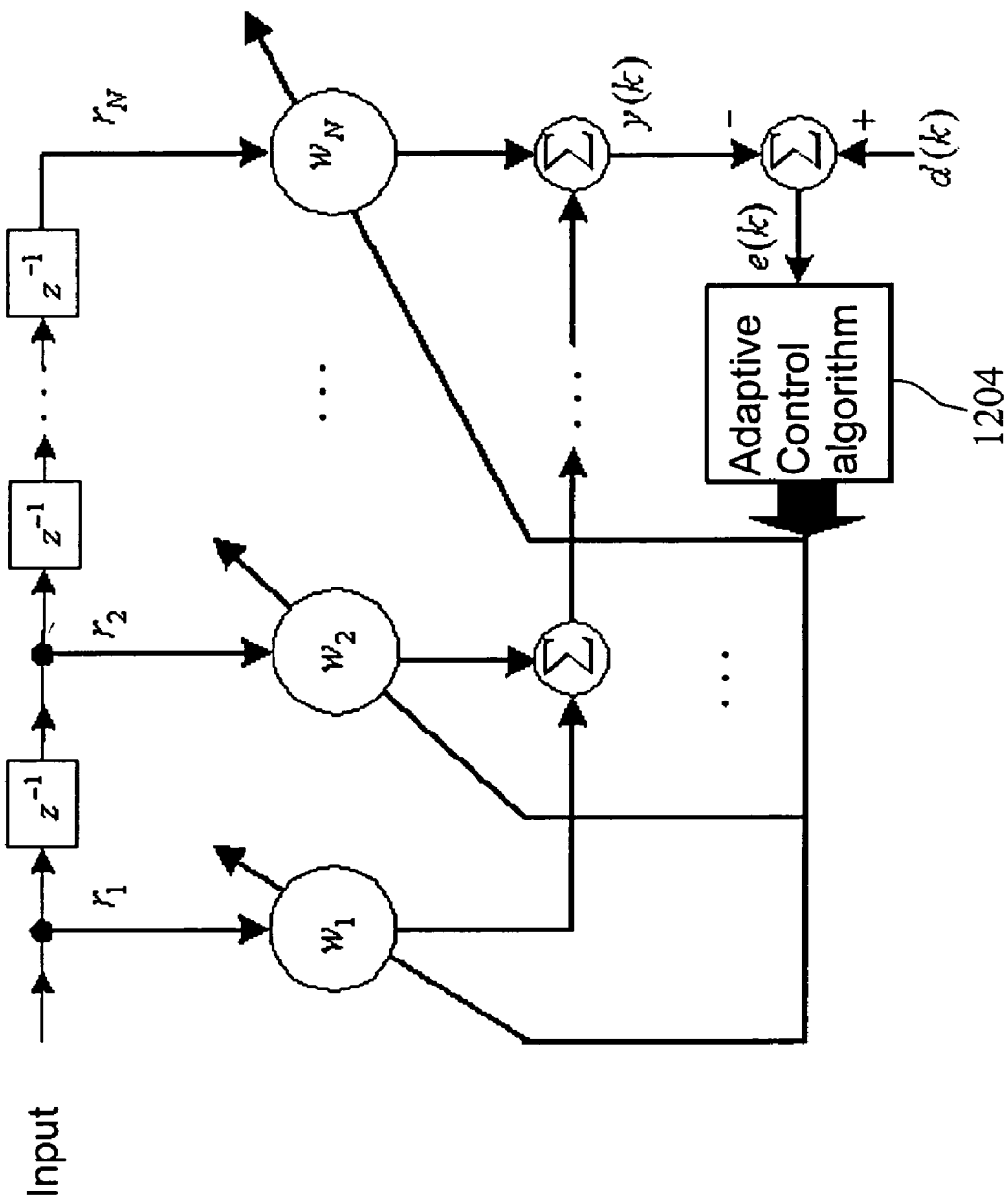
FIG. 12 is a drawing showing a prior art FIR transversal adaptive equalizer.
Figure 13:
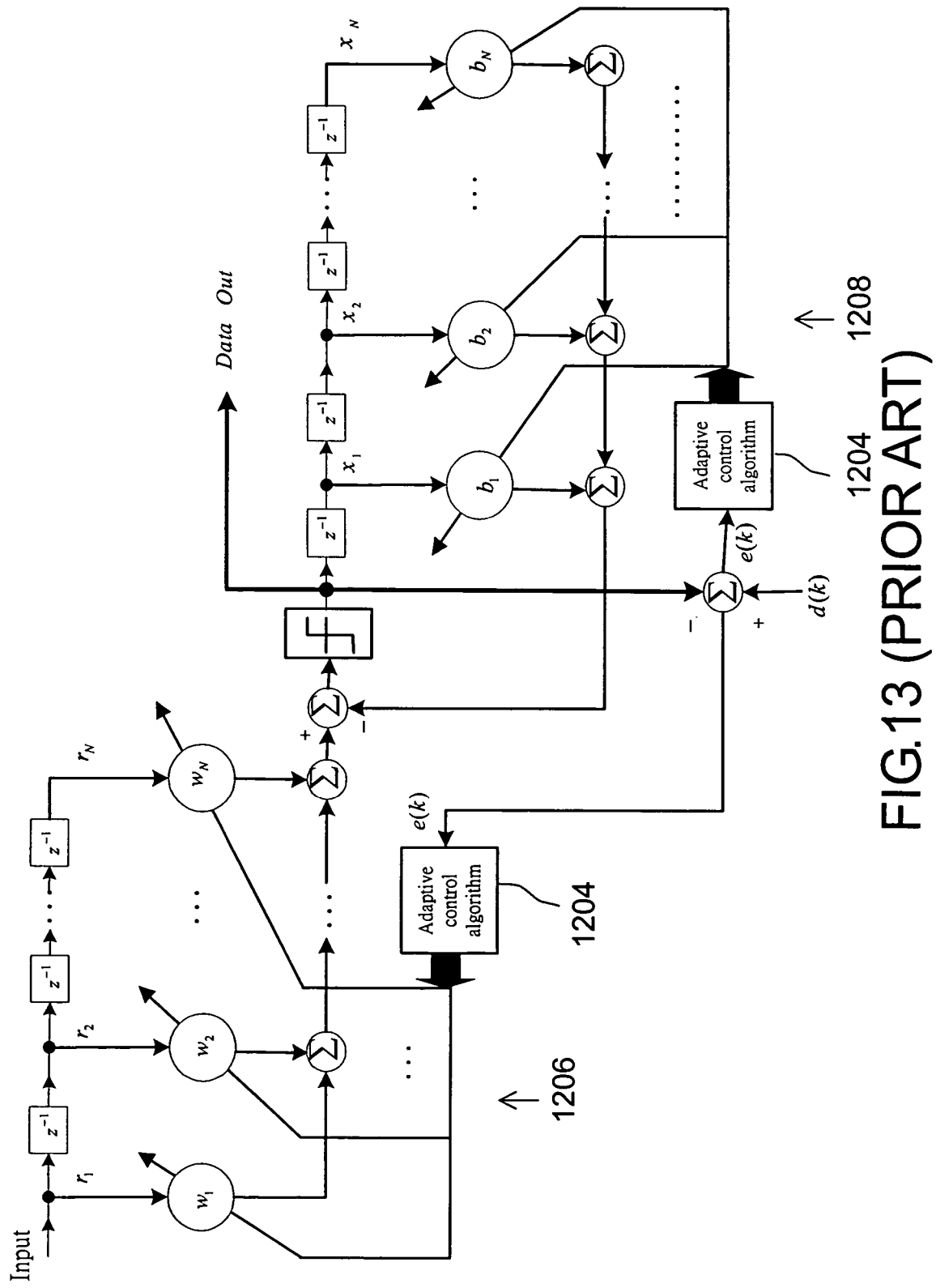
FIG. 13 is a drawing showing a prior art DFE transversal adaptive equalizer.
Figure 14:
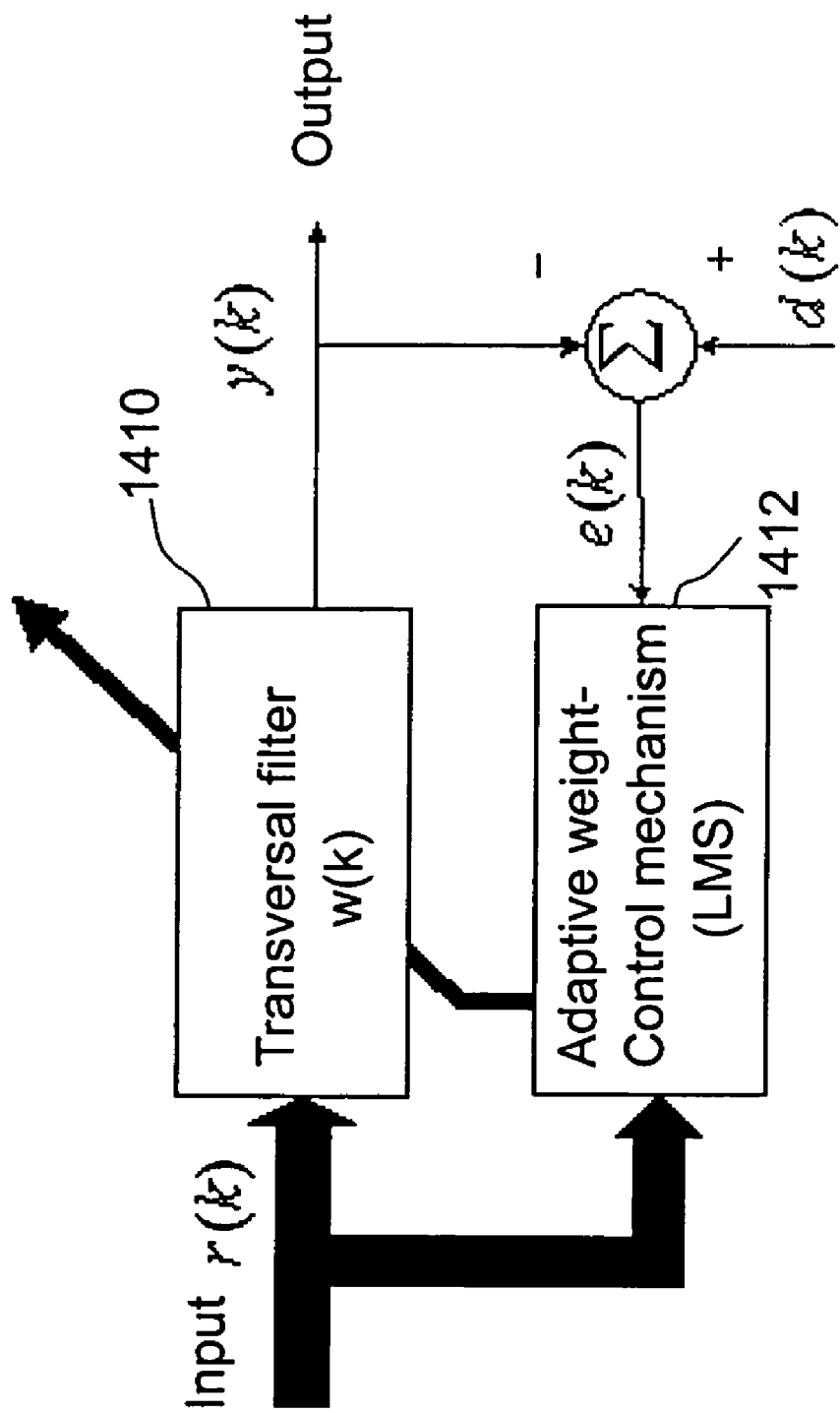
FIG. 14 is a schematic drawing showing a prior art LMS algorithm.
Figure 15:
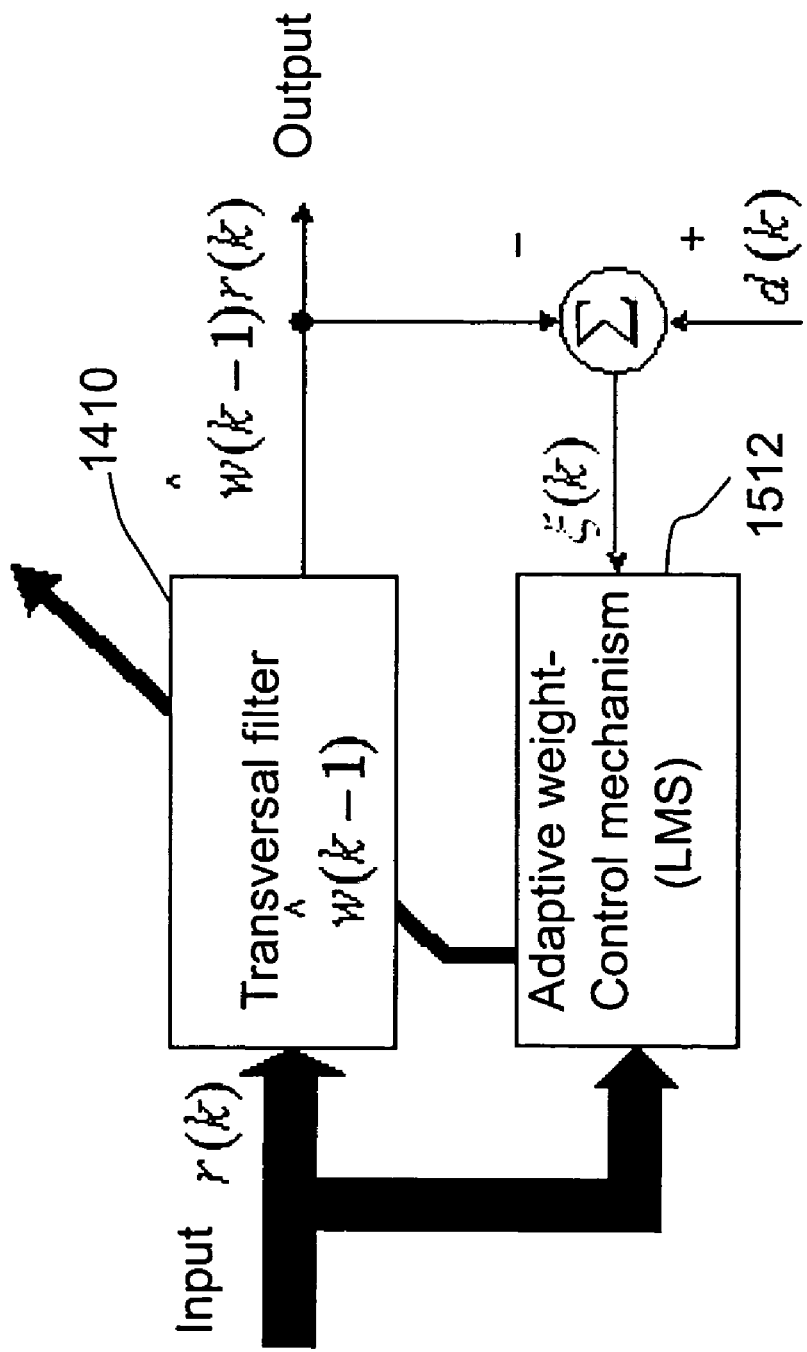
FIG. 15 is a schematic drawing showing a prior art RLS algorithm.

FIGS. 11A-11C are simulations of CM cost surface formula and convergent rate for according to the present invention. Referring to FIGS. 11A-11C, DFE-HCMA algorithm simulation has following assumptions: (1) the equalizer has N input signals; and (2) the feed-forward filter set 106 and the feedback filter set 108 comprise two-level processing ($\alpha=2$). Every adaptive algorithm 104 of the feed-forward filter set 106 comprises $\sqrt{N}$ signals ($\beta=\sqrt{N}$). Except of the last adaptive algorithm of the first level of the feedback filter set 108, each of the other adaptive algorithms 104 of the feedback filter set 108 comprises $\sqrt{N}$ signals. The length of the last adaptive algorithm 104 is $\sqrt{N}-1$. In this embodiment, the frequency response is represented by the following equation:

$$h(k) = \frac{1}{2}[1 + \cos(2\pi(k-2)/W)],$$

k=1,2,3,4 (it represents four multiple-route signals), W=3.1

The length N of the DFE equalizer is equal to 81, 100 and 121. SNR is equal to 30 dB.

Referring to FIGS. 11A-11C, DFE-HCMA algorithm has higher convergent rate than that of DFE-CMA. During the static status, DFE-HCMA algorithm has a smaller cost function than that of DFE-CMA algorithm shown in Table 4. According to the hierarchical structure and design thereof, the hierarchical structure does enhance the convergent rate of DFE-CMA algorithm.

TABLE 4

|  | DFE-HCMA | DFE-CMA |
| --- | --- | --- |
| N = 64 | 0.020173 | 0.076936 |
| N = 100 | 0.017423 | 0.118227 |
| N = 121 | 0.019013 | 0.140263 |

In these embodiments of the present invention, the transmitted data are not correlated. During data transmission, the assumption is reasonable. If the data, such as animation, are highly correlated, a de-correlation process should be performed.

In these embodiments of the present invention, the ratio of number of multiple routes to the number of equalizer taps should not be too high, or the performance of the hierarchical equalizer would be affected.

In these embodiments of the present invention, the step size $\mu$ of HLMS algorithm is described as below:

$$\mu(HLMS) = \mu(LMS) \times N/\beta$$

In these embodiments of the present invention, the step size $\mu$ is also applied to HCMA algorithm.

In these embodiments of the present invention, the hierarchical equalizer is adapted to be applied to a single carrier system, such as DSL, WLAN, Cellular, TDMA, or CDMA. If it is CDMA, the structure should be a RAKE structure.

Accordingly, the hierarchical adaptive equalizer and the design method thereof of the present invention comprises following advantages:

(1) According to the hierarchical adaptive equalizer and the design method thereof of the present invention, the hierarchical adaptive HLMS and DFE-HLMS equalizers do enhance convergent rate of algorithm and reduce MSE thereof.

(2) The hierarchical adaptive equalizer and the design method thereof of the present invention allocate the execution of algorithm to every level and every adaptive algorithm. The present invention allocates input signals to hierarchical adaptive algorithms. RLS calculation is then performed. Due to the hierarchical processing, the output of the hierarchical adaptive equalizer has more precise output, higher convergent rate, minimum MSE in static status, and low calculation complexity. The calculation complexity according to the hierarchical adaptive equalizer of the present invention is $O(N\beta)$, which is lower than that of RLS, $O(N^2)$, because N is not less than $\beta$.

(3) According to the hierarchical adaptive equalizer and the design method thereof of the present invention, the present invention finds out the shortest distance during convergence. Such finding enhances the convergent rate of cost function of CMA algorithm. In addition, HCMA algorithm has the minimum error and is converged to the preferred value with minimum error. After stable convergence, local minimums reach the global minimum and do not fall in some worse local minimum. Accordingly, intersymbol interference can be substantially reduced.

(4) The hierarchical adaptive equalizer and the design method thereof of the present invention can be applied to nonlinear equalizers, such as DFE equalizer.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A design method of a hierarchical adaptive equalizer, the design method comprising:
   providing N delay elements;
   dividing the N delay elements into a plurality of adaptive algorithms, each of the adaptive algorithms having $\beta$ delay elements; and
   logically structuring a hierarchical tree with the adaptive algorithms, for increasing convergent rate of the adaptive algorithms and promoting accuracy of an output of the hierarchical adaptive equalizer, the hierarchical tree comprising comprises $\alpha$ levels, a top first level comprising $\beta^{\alpha-1}$ adaptive algorithms, a top second level comprising $\beta^{\alpha-2}$ adaptive algorithms, a bottom level comprising one adaptive algorithm, wherein each adaptive algorithm in each level of the hierarchical tree has $\beta$ inputs obtained from division of the N delay elements, N, $\alpha$ and $\beta$ are integers not less than 1, and N is not less than $\beta$.

2. The design method of a hierarchical adaptive equalizer of claim 1, wherein an output of the top first level of the hierarchical tree is an input of the top second level of the hierarchical tree.

3. The design method of a hierarchical adaptive equalizer of claim 1, wherein an output from the bottom level of the hierarchical tree is equivalent to an output from the hierarchical adaptive equalizer.

4. The design method of a hierarchical adaptive equalizer of claim 1, wherein the hierarchical adaptive equalizer is adapted for an algorithmic method.

5. The design method of a hierarchical adaptive equalizer of claim 4, wherein the algorithmic method comprises a Least-Mean-Square (LMS) algorithm.

6. The design method of a hierarchical adaptive equalizer of claim 4, wherein the algorithmic method comprises a Recursive-Least-Square (RLS) algorithm.

7. The design method of a hierarchical adaptive equalizer of claim 4, wherein the algorithmic method comprises a constant modulus algorithm (CMA).

8. The design method of a hierarchical adaptive equalizer of claim 4, wherein the algorithmic method comprises a Decision-Feedback-Equalizer-Least-Mean-Square (DFE-LMS) algorithm.

9. The design method of a hierarchical adaptive equalizer of claim 4, wherein the algorithmic method comprises a Decision-Feedback-Equalizer-Recursive-Least-Square (DFE-RLS) algorithm.

10. The design method of a hierarchical adaptive equalizer of claim 4, wherein the algorithmic method comprises a Decision-Feedback-Constant-Modulus algorithm (DFE-CMA).

11. The design method of a hierarchical adaptive equalizer of claim 4, wherein the algorithmic method comprises a hybrid algorithm of two or more of the LMS, RLS, CMA, DFE-LMS, DFE-RLS, and DFE-CMA algorithms.

12. A hierarchical adaptive equalizer, characterized in comprising a hierarchical tree for increasing convergent rate of adaptive algorithms and promoting accuracy of an output of the hierarchical adaptive equalizer, the hierarchical tree comprising $\alpha$ levels, a top first level of the hierarchical tree comprising $\beta^{\alpha-1}$ adaptive algorithms, a top second level comprising $\beta^{\alpha-2}$ adaptive algorithms, a bottom level comprising an adaptive algorithm, wherein $\beta$ represents a number of delay elements as inputs for each of the adaptive algorithms in each level of the hierarchical tree, and $\alpha$ and $\beta$ are integers not less than 1.

13. The hierarchical adaptive equalizer of claim 12, wherein the hierarchical adaptive equalizer comprises N delay elements, N is equal to $\beta^{\alpha}$, and N is an integer not less than $\beta$.

14. The hierarchical adaptive equalizer of claim 12, wherein an output of the top first level of the hierarchical tree is an input of the top second level of the hierarchical tree.

15. The hierarchical adaptive equalizer of claim 12, wherein an output from the bottom level of the hierarchical tree is equivalent to an output from the hierarchical adaptive equalizer.

16. The hierarchical adaptive equalizer of claim 12, wherein the adaptive algorithms adopt an algorithmic method to execute a minimum algorithmic process and to individually update weightings of the adaptive algorithms.

17. The hierarchical adaptive equalizer of claim 16, wherein the algorithmic method comprises a Least-Mean-Square (LMS) algorithm.

18. The hierarchical adaptive equalizer of claim 16, wherein the algorithmic method comprises a Recursive-Least-Square (RLS) algorithm.

19. The hierarchical adaptive equalizer of claim 16, wherein the algorithmic method comprises a constant modulus algorithm (CMA).

20. The hierarchical adaptive equalizer of claim 16, wherein the algorithmic method comprises a Decision-Feedback-Equalizer-Least-Mean-Square (DFE-LMS) algorithm.

21. The hierarchical adaptive equalizer of claim 16, wherein the algorithmic method comprises a Decision-Feedback-Equalizer-Recursive-Least-Square (DFE-RLS) algorithm.

22. The hierarchical adaptive equalizer of claim 16, wherein the algorithmic method comprises a Decision-Feedback-Constant-Modulus algorithm (DFE-CMA).

23. The hierarchical adaptive equalizer of claim 16, wherein the algorithmic method comprises a hybrid algorithm of two or more of the LMS, RLS, CMA, DFE-LMS, DFE-RLS, and DFE-CMA algorithms.

\* \* \* \* \*